(12) United States Patent
Fujita et al.

(10) Patent No.: US 11,695,024 B2
(45) Date of Patent: Jul. 4, 2023

(54) IMAGE SENSOR

(71) Applicant: Samsung Electronics Co., Ltd., Suwon-si (KR)

(72) Inventors: Masato Fujita, Suwon-si (KR); Yunki Lee, Hwaseong-si (KR); Eunsub Shim, Hwaseong-si (KR); Kyungho Lee, Suwon-si (KR); Bumsuk Kim, Hwaseong-si (KR); Taehan Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 16/996,047

(22) Filed: Aug. 18, 2020

(65) Prior Publication Data
US 2021/0175269 A1 Jun. 10, 2021

(30) Foreign Application Priority Data
Dec. 5, 2019 (KR) .................. 10-2019-0160516

(51) Int. Cl.
| | |
|---|---|
| *H01L 27/146* | (2006.01) |
| *H04N 25/59* | (2023.01) |
| *H04N 25/704* | (2023.01) |
| *H04N 25/709* | (2023.01) |
| *H04N 25/772* | (2023.01) |

(52) U.S. Cl.
CPC .... *H01L 27/14612* (2013.01); *H01L 27/1463* (2013.01); *H01L 27/14603* (2013.01); *H01L 27/14621* (2013.01); *H01L 27/14627* (2013.01); *H01L 27/14636* (2013.01); *H01L 27/14645* (2013.01); *H04N 25/59* (2023.01); *H04N 25/704* (2023.01); *H04N 25/709* (2023.01); *H04N 25/772* (2023.01)

(58) Field of Classification Search
CPC ......... H01L 27/14612; H01L 27/14603; H01L 27/14621; H01L 27/14627; H01L 27/1463; H01L 27/14636; H01L 27/14645; H01L 27/14643; H01L 27/14609; H01L 27/14605; H04N 5/3559; H04N 5/36961; H04N 5/3698; H04N 5/37455; H04N 5/37457; H04N 5/23212; H04N 5/357

See application file for complete search history.

(56) References Cited

U.S. PATENT DOCUMENTS 10,382,666 B2 8/2019 Kim et al.
10,431,619 B2 10/2019 Masagaki et al.
(Continued)

*Primary Examiner* — Tony Ko
(74) *Attorney, Agent, or Firm* — Harness, Dickey & Pierce, P.L.C.

(57) ABSTRACT

An image sensor includes a first photodiode group, a second photodiode group, a first transfer transistor group, a second transfer transistor group, a floating diffusion region of a substrate in which electric charges generated in the first photodiode group are stored, and a power supply node for applying a power supply voltage to the second photodiode group. A barrier voltage is applied to at least one transfer transistor of the second transfer transistor group. The power supply voltage allows electric charges, generated in the second photodiode group, to migrate to the power supply node, and the barrier voltage forms a potential barrier between the second photodiode group and the floating diffusion region.

20 Claims, 33 Drawing Sheets

(56) References Cited

U.S. PATENT DOCUMENTS

| | | |
|---|---|---|
| 2018/0269241 A1* | 9/2018 | Yamashita ........ H01L 27/14623 |
| 2018/0309947 A1 | 10/2018 | Hatano et al. |
| 2019/0067361 A1 | 2/2019 | Kato et al. |
| 2019/0148426 A1 | 5/2019 | Okuno et al. |
| 2019/0181165 A1 | 6/2019 | Tashiro |
| 2019/0215442 A1 | 7/2019 | Kim et al. |

* cited by examiner

IMAGE SENSOR

CROSS-REFERENCE TO RELATED APPLICATION(S)

This application claims benefit of priority to Korean Patent Application No. 10-2019-0160516 filed on Dec. 5, 2019 in the Korean Intellectual Property Office, the disclosure of which is incorporated herein by reference in its entirety.

BACKGROUND

The present disclosure relates to an image sensor.

An image sensor is a semiconductor-based sensor for receiving light and generating an electrical signal. For example, an image sensor converts light into an electrical signal that conveys information used to form an image. An image sensor may include a pixel array including a plurality of pixels, a logic circuit for driving the pixel array and generating an image, and the like. The plurality of pixels may include a photodiode for generating electric charge by reacting to external light, a pixel circuit for converting the electric charge generated by the photodiode into an electrical signal, and the like. An image sensor has traditionally been employed in cameras for capturing still and video images, but is now widely applied to smartphones, tablet personal computers (PCs), laptop computers, televisions, vehicles, and the like. Recently, a variety of methods for improving noise characteristics, a dynamic range, and the like, of an image sensor have been developed.

SUMMARY

Example embodiments provide an image sensor, capable of limiting and/or preventing crosstalk from occurring when providing an autofocusing function.

According to an example embodiment, an image sensor includes: a first photodiode group including photodiodes and a second photodiode group including photodiodes, a first transfer transistor group including at least one transfer transistor connected to the first photodiode group; a second transfer transistor group including at least one transfer transistor connected to the second photodiode group; a floating diffusion region of a substrate, the floating diffusion region configured to store electric charges generated in the first photodiode group as the at least one transfer transistor of the first transfer transistor group is turned on; and a power supply node connected to the second photodiode group, the power supply node configured to have a power supply voltage applied thereto for applying the power supply voltage to the second photodiode group. The power supply voltage allows electric charges generated in the second photodiode group to migrate to the power supply node. The at least one transfer transistor of the second transfer transistor group is configured to have a barrier voltage applied thereto. The barrier voltage forms a potential barrier between the second photodiode group and the floating diffusion region.

According to an example embodiment, an image sensor includes a first pixel area and a second pixel area sharing a single microlens, a device isolation layer electrically isolating the first pixel area and the second pixel area from each other, at least one transfer transistor connected to the first pixel area, and at least one drain terminal connected to the second pixel area. The at least one drain terminal is configured to have a power supply voltage applied thereto.

According to an example embodiment, an image sensor includes a normal pixel group configured to generate an image and an autofocusing pixel group configured to provide an autofocusing function. The autofocusing pixel group and the normal pixel group have substantially a same sensitivity as each other. The autofocusing pixel group includes unit pixels sharing a single microlens and each including a single photodiode, a device isolation layer electrically isolating the unit pixels from each other, and a drain terminal configured to have a constant voltage input thereto. Photodiodes in the autofocusing pixel group include a first photodiode group and a second photodiode group. The drain terminal is connected to the second photodiode group. The first photodiode group is configured to generate electric charges that migrate from the first photodiode group to a floating diffusion region of a substrate. The second photodiode is configured to generate electric charges that are discharged to the drain terminal.

According to an example embodiment, an image sensor includes a pixel array including a normal pixel group and an autofocusing pixel group and a controller configured to generate an image based on a signal generated from the normal pixel group and to provide an autofocusing function based on a signal generated from the autofocusing pixel group. The autofocusing pixel group includes unit pixels sharing a single microlens and each including either one of an autofocusing photodiode and a drain photodiode, a device isolation layer electrically isolating the unit pixels from each other, and a drain terminal connected to the drain photodiode. The autofocusing photodiode is configured to generate electric charges that migrate to a floating diffusion region of a substrate, and electric charges generated from the drain photodiode are discharged to the drain terminal. The pixel array has either one of a red-green-green-blue (RGGB) pattern and a red-green-blue-white (RGBW) pattern.

BRIEF DESCRIPTION OF DRAWINGS

The above and other aspects, features, and effects of the present disclosure will be more clearly understood from the following detailed description, taken in conjunction with the accompanying drawings.

FIG. 11B is a cross-sectional view taken along line II-IT in FIG. 11A.

DETAILED DESCRIPTION

When the terms "about" or "substantially" are used in this specification in connection with a numerical value, it is intended that the associated numerical value include a tolerance of s-sectional view taken along line III-III' in FIG. 11. Action based on a range includes all values therebetween such as increments of 0.1%.

Hereinafter, example embodiments will be described with reference to the accompanying drawings.

Figure 1:
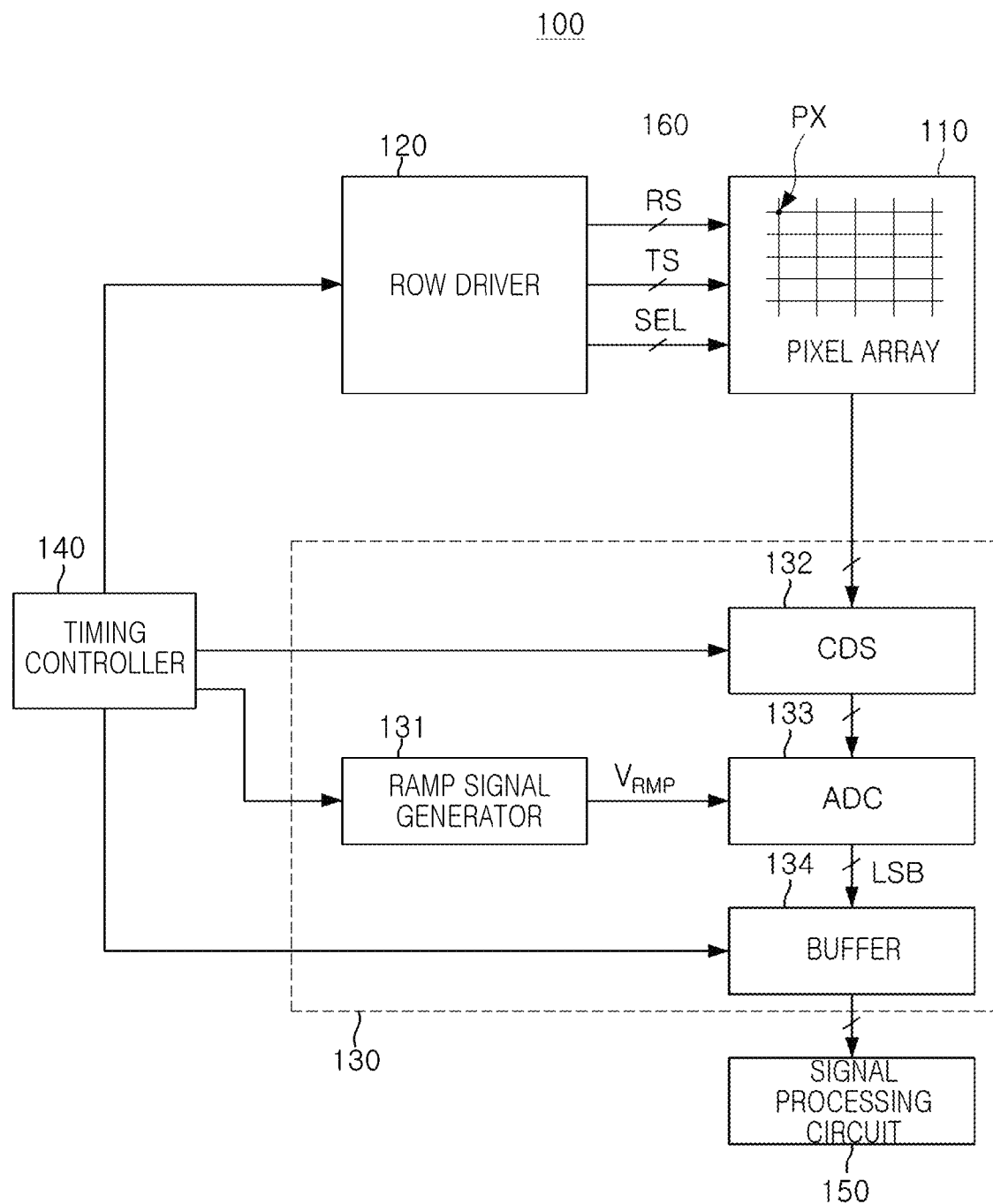
FIG. 1 is a block diagram of an image sensor according to an example embodiment.

FIG. 1 is a block diagram of an image sensor according to an example embodiment.

Referring to FIG. 1, am image sensor 100 according to an example embodiment may include a pixel array 110, a row driver 120, a read-out circuit 130, a timing controller 140, and a signal processing circuit 150.

The image sensor 100 may convert light, received from an external device, into an electrical signal and may generate image data. The pixel array 110 included in the image sensor 100 may include a plurality of pixels PX, and the plurality of pixels PX may include a photoelectric device configured to receive light and to generate electric charge. The photoelectric device may be, for example, a photodiode PD. The plurality of pixels PX may be connected to a plurality of row lines, extending in a first direction, and a plurality of column lines extending in a second direction. In an example embodiment, each of the plurality of pixels PX may include two or more photoelectric devices to generate pixel signals corresponding to light of various colors or to provide an autofocusing function.

Each of the plurality of pixels PX may include a pixel circuit configured to generate a pixel signal from electric charges generated by photodiodes. As an example, the pixel circuit may include a transfer transistor, a driving transistor, a select transistor, a reset transistor, a floating diffusion region, and the like. A pixel circuit may output a reset voltage and a pixel voltage. A pixel voltage may correspond to electric charges generated by photodiodes included in each of the plurality of pixels and stored in the floating diffusion region. In an example embodiment, two or more adjacent pixels PX may constitute a single pixel group, and two or more pixels PX included in a pixel group may share at least a portion of the transfer transistor, the driving transistor, the select transistor, and the reset transistor.

The row driver 120 may input a driving signal to a plurality of row lines to drive a pixel array 110. For example, the driving signal may include a transfer control signal TS configured to control a transfer transistor of a pixel circuit, a reset control signal RS configured to control a reset transistor of the pixel circuit, and a select control signal SEL configured to control a select transistor of the pixel circuit, or the like. As an example, the row driver 120 may sequentially drive a plurality of row drivers.

The read-out circuit may include a ramp signal generator 131, a sampling circuit 132, an analog-to-digital converter (ADC) 133, and a buffer 134. The sampling circuit may include a plurality of samplers connected to pixels PX through a plurality of column lines. In example embodiments, the sampler may be a correlated double sampler (CDS). The sampler may detect a rest voltage and a pixel voltage from the pixels PX connected to a selected row line, driven by the row driver 120, among a plurality of row lines. The samplers may output a difference between the reset voltage and the pixel voltage as an analog signal.

The analog-to-digital converter 133 may receive the ramp voltage $V_{RMP}$ from the ramp signal generator 131 and may receive an analog signal from the sampling circuit 132. The analog-to-digital converter 133 may compare the analog signal with the ramp voltage $V_{RMP}$, and may convert a comparison result into a digital signal and output the digital signal as the image data LSB. The image data LSB may have a value increased as a difference between the reset voltage and the pixel voltage is increased. Therefore, the image data LSB may have a value increased as the intensity of light, received by the photodiode, is increased.

The buffer 134 may temporarily store the image data LSB received from the analog-to-digital converter 133.

The row driver 120 and the read-out circuit 130 may be controlled by the timing controller 140. The timing controller 140 may control operation timings of the row driver 120 and the read-out circuit 130. The row driver 120 may control an operation of the pixel array 110 in units of rows under the control of the timing controller 140.

The signal processing circuit 150 may generate an image using the image data LSB transmitted from the buffer 134. The signal processing circuit 150 may process the image data LSB and may output the processed image data as an image.

In some embodiments, the row driver 120, timing controller 140, analog-to-digital converter (ADC) 133, ramp signal generator 131, and/or other features of the of the image sensor 100 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), an analog element (e.g., circuit), an application processor, etc. The buffer 134 may include a volatile memory chip such as dynamic random access memory (RAM) (DRAM) or static RAM (SRAM), or may include a non-volatile memory chip such as phase-change RAM (PRAM), magnetoresistive RAM (MRAM), ferroelectric RAM (FeRAM), resistive RAM (RRAM), a high bandwidth memory (HBM), or a combination thereof.

An autofocusing function may be provided by shielding a portion of a photodiode with a metal, or the like, and detecting only light, incident on an unshielded portion of the photodiode, in a plurality of pixels PX. However, in a method of detecting a phase difference using a metal or the like, light may be reflected by the metal, or the like, to cause crosstalk between adjacent pixels.

An image sensor according to an example embodiment may adjust a doping concentration between a substrate and at least one photodiode, among photodiodes constituting a pixel group, to form a drain terminal connected to the at least one photodiode. Electric charges, generated by the at least one photodiode, may not migrate to a floating diffusion region and may be discharged to the drain terminal. Thus, crosstalk may be limited and/or prevented from occurring when the pixel group provides the autofocusing function.

Figure 2:
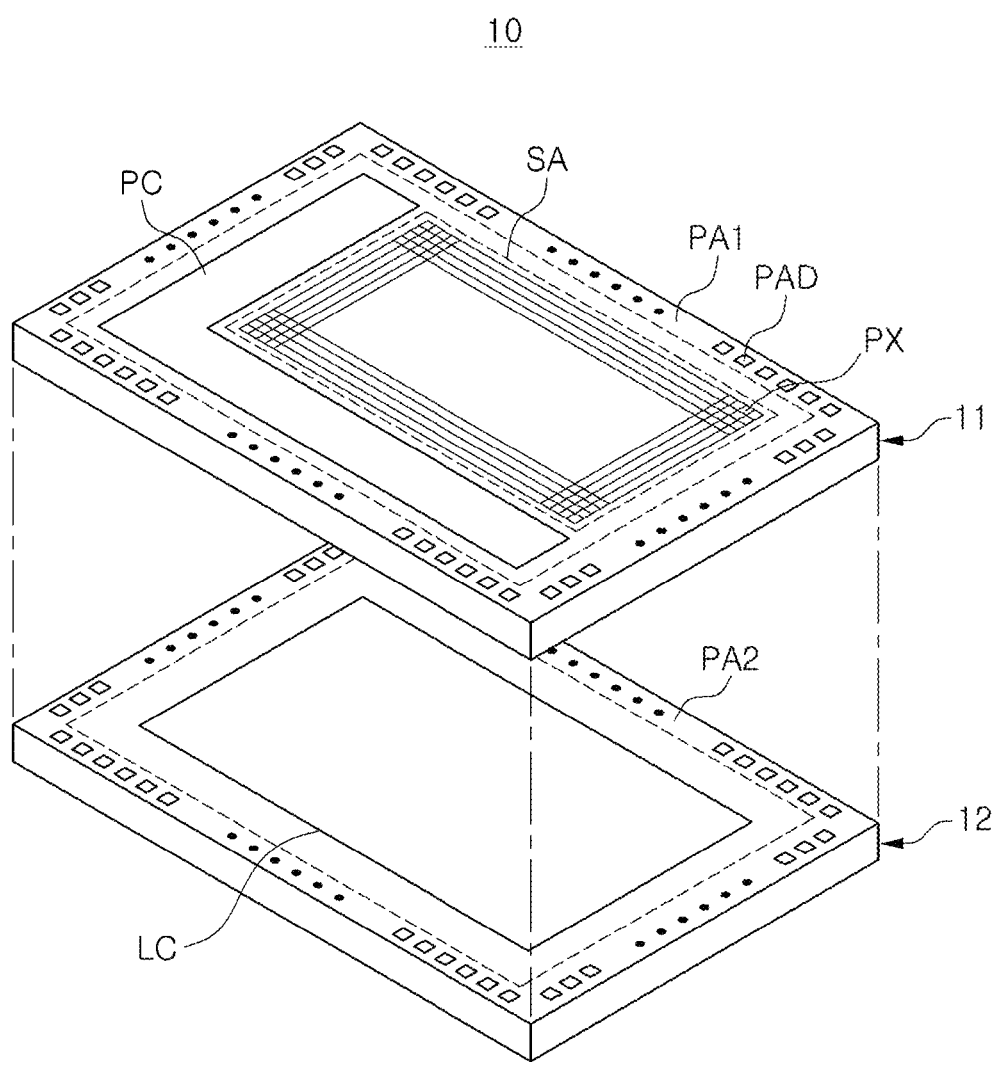
FIGS. 2 and 3 are schematic diagrams of an image sensor according to an example embodiment, respectively.
Figure 3:
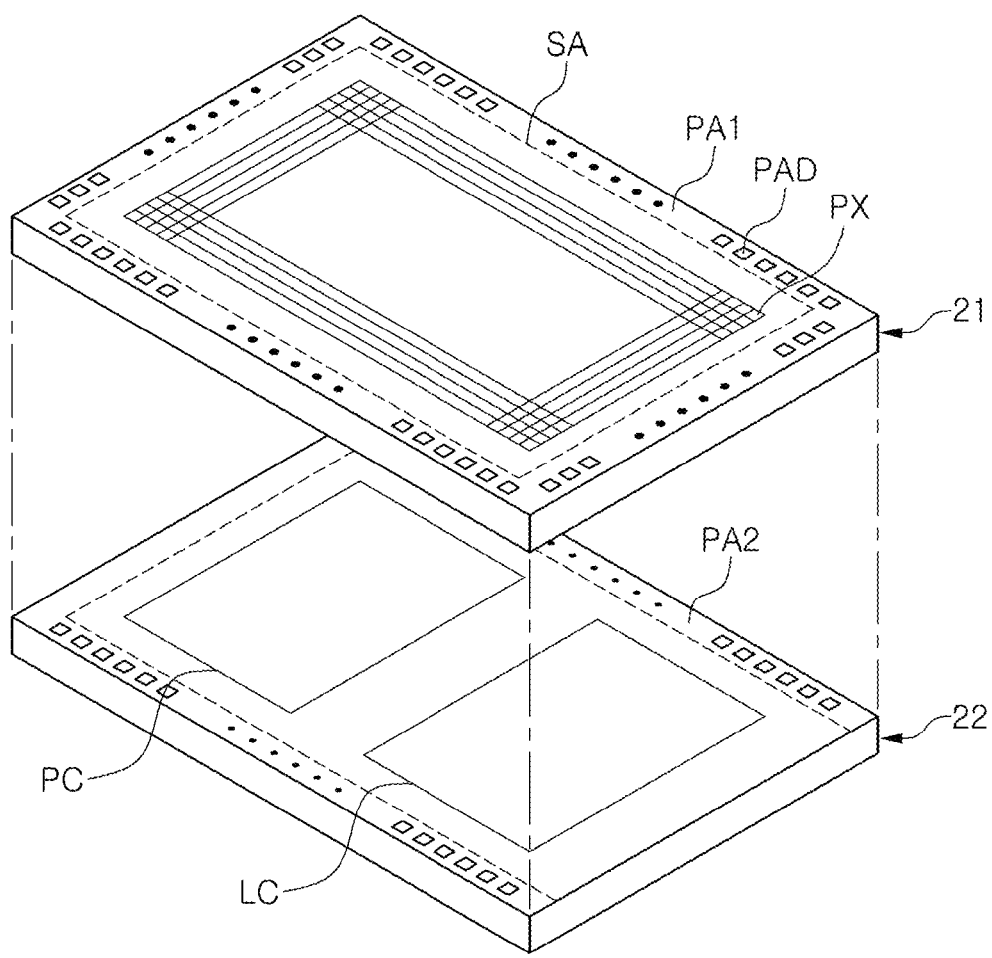

FIGS. 2 and 3 are schematic diagrams of an image sensor according to an example embodiment, respectively.

Referring to FIG. 2, an imaging device 10 according to an example embodiment may include a first layer 11 and a second layer 12 provided below the first layer 11. The first layer 11 and the second layer 12 may be stacked in a direction perpendicular to each other.

The first layer 11 may have a sensing area SA, a peripheral circuit PC, and a first pad area PAL In the sensing area SA, a plurality of pixels PX may be provided. The peripheral circuit PC may be provided with elements for driving the plurality of pixels PX. The first pad area PA1 may be provided around the sensing area SA and the peripheral circuit PC.

The first pad area PA1 includes a plurality of upper pads PAD, and the plurality of upper pads PAD may be connected to pads and logic circuit LC provided in a second pad area PA2 of the second layer 12 through vias or the like.

Each of the plurality of pixels PX may include a photodiode receiving light to generate electric charges, a pixel circuit processing the electric charges generated by the photodiode, and the like. The pixel circuit may include a plurality of transistors for outputting a voltage corresponding to the electric charges generated by the photodiode.

The first layer 11 may include a plurality of elements for providing a peripheral circuit PC. A plurality of elements, included in the peripheral circuit PC, may provide circuits for driving a pixel circuit provided in the first layer 11, for example, a row driver, a column driver, a CDS, an ADC, a timing controller, and the like. The plurality of elements, included in the peripheral circuit PC, may be connected to the pixel circuit through the first and second pad areas PA1 and PA2. The peripheral circuit PC may obtain a reset voltage and a pixel voltage from the plurality of pixels PX to generate a pixel signal.

The second layer 12 may include a logic circuit LC and a second pad area PA2. The logic circuit LC may include a power supply circuit, an input/output interface, an image signal processor (ISP), and the like. The second pad area PA2 may be provided around the logic circuit LC.

Referring to FIG. 3, an imaging device apparatus 20 according to an example embodiment may include a first layer 21 and a second layer 22. The first layer 21 may include a sensing area SA, in which a plurality of pixels PX are provided, and a first pad area PA1 provided around the sensing area SA. The first pad area PA1 may include a plurality of upper pads PAD. Through vias, or the like, the plurality of upper pads PAD may be connected to pads, the peripheral circuit PC, and the logic circuit LC, provided in the second pad area PA2 of the second layer 22.

Figure 4:
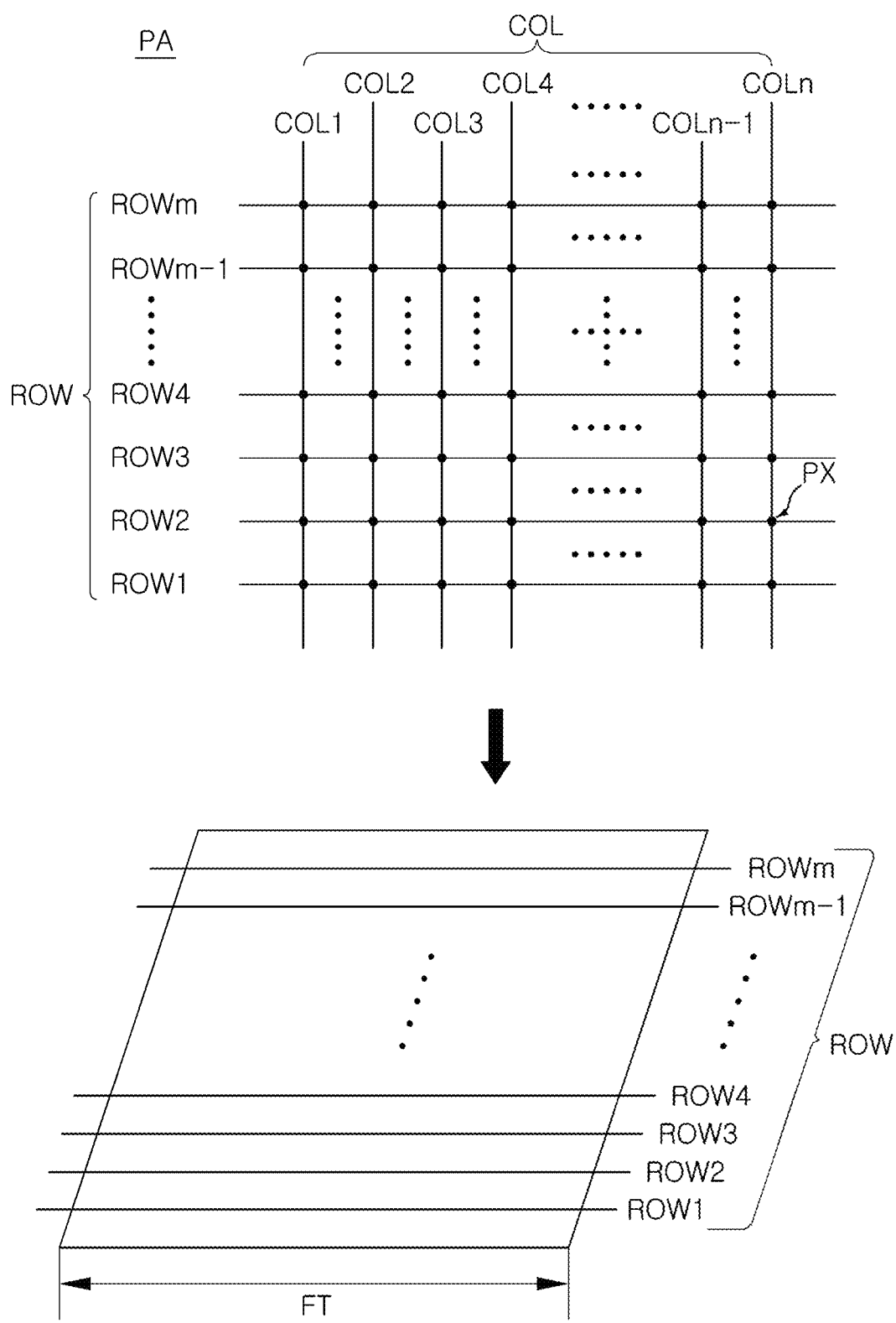
FIG. 4 illustrates an operation of an image sensor according to an example embodiment.

FIG. 4 illustrates an operation of an image sensor according to an example embodiment.

Referring to FIG. 4, a pixel array PA of an image sensor according to an example embodiment may include a plurality of pixels PX. The plurality of pixels PX may be connected to a plurality of row lines ROW1 to ROWm (ROW) and a plurality of column lines COL1 to COLn (COL). The image sensor may drive the plurality of pixels PX in units of a plurality of row lines ROW. As an example, time required to drive a selected driving line among the row lines ROW and to read a reset voltage and a pixel voltage from pixels PX connected to the selected driving line may be defined as one horizontal period. The image sensor may operate in a rolling shutter manner in which the plurality of row lines ROW are sequentially driven.

A frame period FT of the image sensor may be defined as times required to read a reset voltage and a pixel voltage from all pixels included in the pixel array PA. As an example, the frame period FT may be greater than or equal to a product of the number of row lines ROW and the horizontal period. The shorter the frame period FT of the image sensor, the greater the number of image frames the image sensor may generate during the same time.

Figure 5:
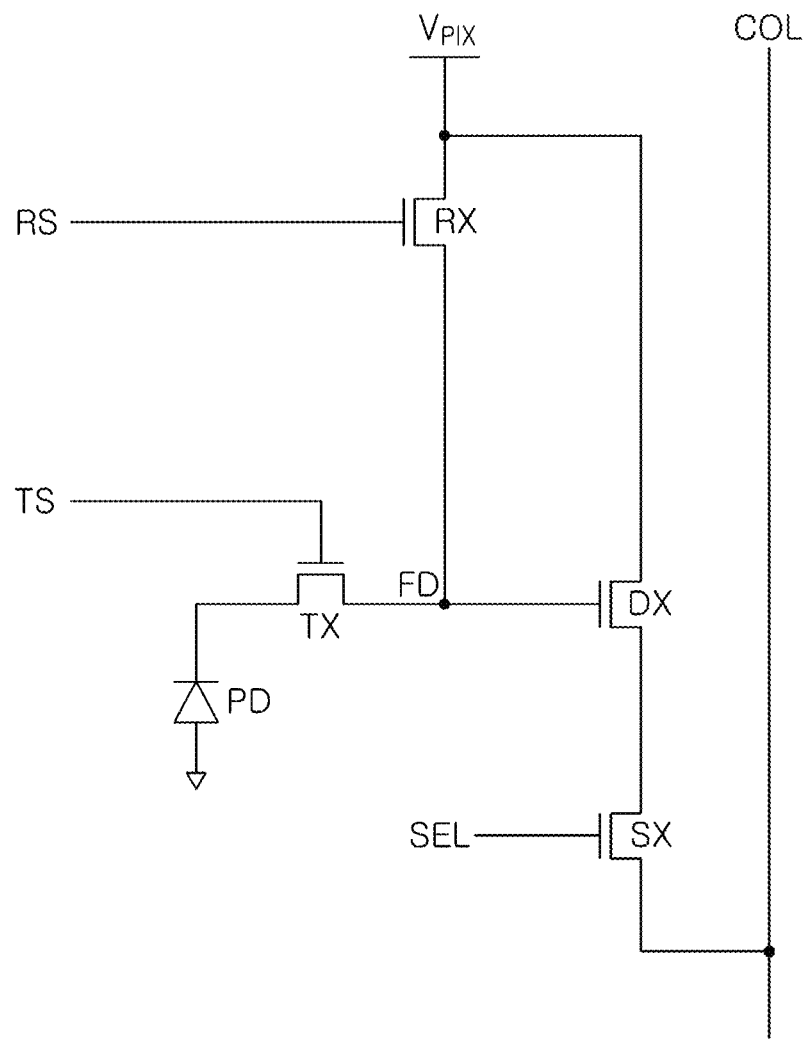
FIG. 5 is a schematic circuit diagram illustrating a pixel included in an image sensor according to an example embodiment.

FIG. 5 is a schematic circuit diagram illustrating a pixel included in an image sensor according to an example embodiment.

Referring to FIG. 5, a pixel included in an image sensor may conclude a photodiode PD configured to generate electric charges in response to light, and a pixel circuit configured to process the electric charges generated by the photodiode PD to output an electrical signal, and the like. As an example, a pixel circuit may include a reset transistor RX, a driving transistor DX, a select transistor SX, a transfer transistor TX, and the like.

The reset transistor RX may be turned on and off by a reset control signal RS. When the reset transistor RX is turned on, a voltage of the floating diffusion region FD may be reset to a power supply voltage VPIX. When the voltage of the floating diffusion region FD is reset, the select transistor SX may be turned on by a select control signal SEL to output the reset voltage to a column line COL.

In an example embodiment, the photodiode PD may generate electrons or holes as a main charge carrier by reacting to light. The transfer transistor TX may be turned on and off by the transfer control signal TS. When the transfer transistor TX is turned on after a reset voltage is output to the column line COL, electric charges generated by exposing the photodiode PD to light may migrate to the floating diffusion region FD. The driving transistor DX may operate as a source-follower amplifier for amplifying the voltage of the floating diffusion region FD. When the select transistor SX is turned on by the select control signal SEL, a pixel voltage corresponding to the electric charges, generated by the photodiode PD, may be output to the column line COL.

Each of the reset voltage and the pixel voltage may be detected by a sampling circuit connected to the column line COL. The sampling circuit may include a plurality of samplers having a first input terminal for receiving a reset voltage and a second input terminal for receiving a pixel voltage. The sampler may compare the reset voltage, input to the first input terminal, with the pixel voltage input to the second input terminal. An analog-to-digital converter ADC may be connected to an output terminal of the sampler, and the analog-to-digital converter may output image data corresponding to a result of the comparison between the reset voltage and the pixel voltage. The signal processing circuit may generate an image using the image data.

Figure 6:
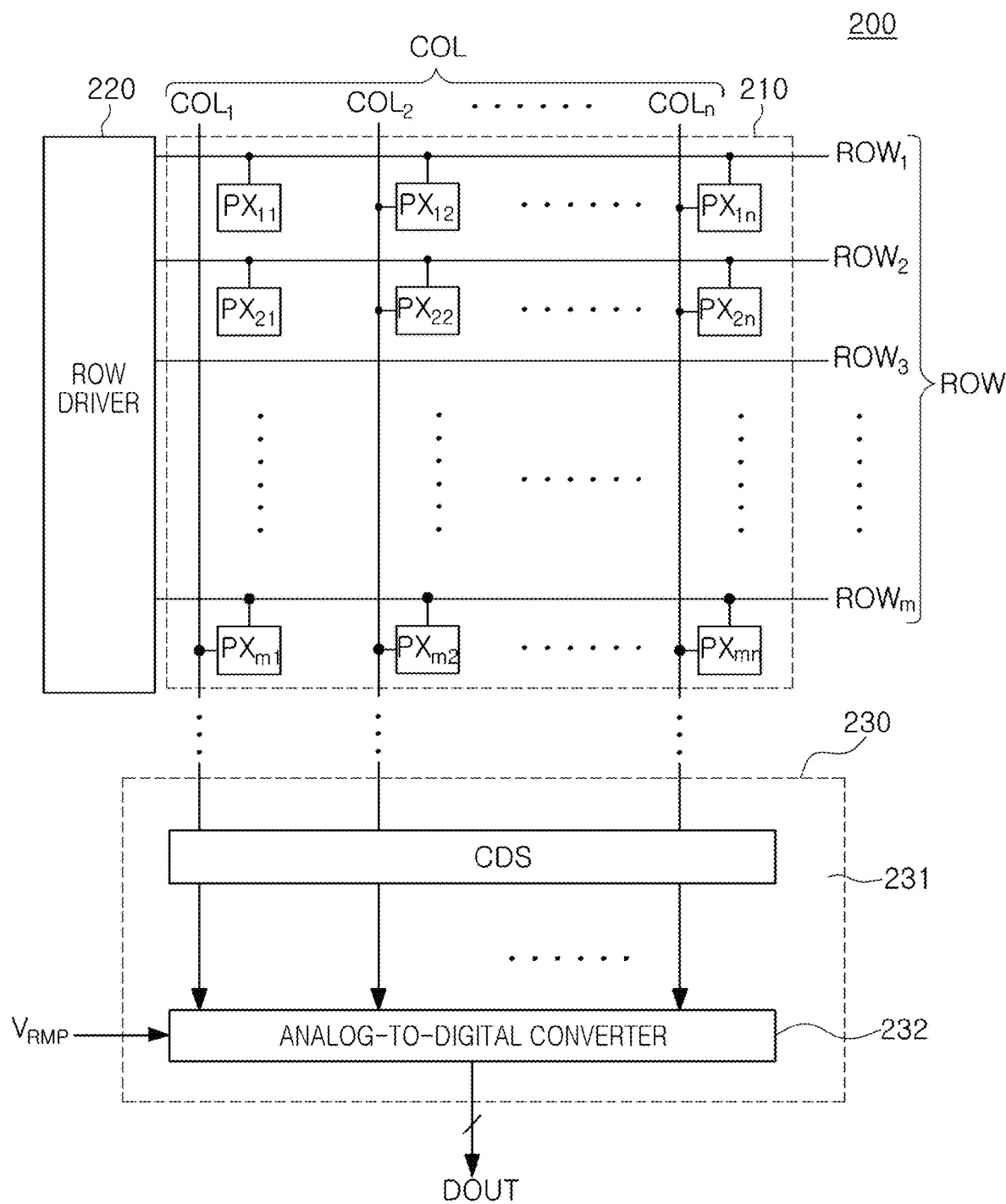
FIG. 6 illustrates an operation of an image sensor according to an example embodiment.

FIG. 6 illustrates an operation of an image sensor according to an example embodiment.

Referring to FIG. 6, an image sensor 200 according to an example embodiment may include a pixel array 210, a row driver 220, and a read-out circuit 230. The pixel array 210 may include a plurality of row lines ROW1 to ROWm (ROW), extending in a direction, and a plurality of column lines COL1 to COLn (COL), intersecting with the plurality of row lines ROW. The row lines ROW and the column lines COL may be connected to the pixels PX11 to PXmn, and each of the pixels PX11-PXmn may include a photodiode and a pixel circuit.

The row driver 220 may input a transfer control signal, a reset control signal, a select control signal, and the like, to each pixel circuit through row lines ROW1 to ROWm (ROW). The read-out circuit 230 may detect the pixel voltage and the reset voltage through the column line COL from the pixels PX connected to the row line ROW selected by the row driver 220. The read-out circuit 230 may include a sampling circuit 231 configured to output a difference between the pixel voltage and the reset voltage, an analog-to-digital converter 232 configured to convert the outputs of the sampling circuit 231 into digital data DOUT, and the like.

The pixel array 210 according to an example embodiment may include a plurality of unit pixels PX11 to PXmn. Each of the plurality of unit pixels PX11 to PXmn may include at least one photodiode. A device isolation layer may be formed between the photodiodes. For example, the device isolation layer may have a back deep trench isolation (BDTI) structure. The device isolation layer may electrically isolate adjacent unit pixels from each other.

Among the plurality of unit pixels PX11 to PXmn, two or more adjacent unit pixels (for example, PX11, PX12, PX21, and PX22) may constitute a single pixel group. Unit pixels, included in a single pixel group, may each include color filters having the same color. The unit pixels, included in the single pixel group, may share at least one floating diffusion region.

The pixel array 210 may include normal pixel groups and autofocusing pixel groups. A controller, included in the image sensor, may generate an image based on a signal generated from the normal pixel groups and may provide an autofocusing function based on a signal generated from the autofocusing pixel groups. The number of normal pixel groups may be greater than the number of autofocusing pixel groups. The autofocusing pixel groups may include a pixel group, generating first image data (for example, left image data), and a pixel group generating second image data (for example, right image data).

In an image sensor according to an example embodiment, a doping concentration between at least one of the photodiodes, included in each of the autofocusing pixel groups, and a substrate may be adjusted to form a drain terminal. Electric charges, generated in the at least one photodiode, may be discharged to the drain terminal to be limited and/or prevented from migrating to the floating diffusion region. Thus, crosstalk can be limited and/or prevented from occurring when the autofocusing pixel groups provide an autofocusing function.

Figure 7A:
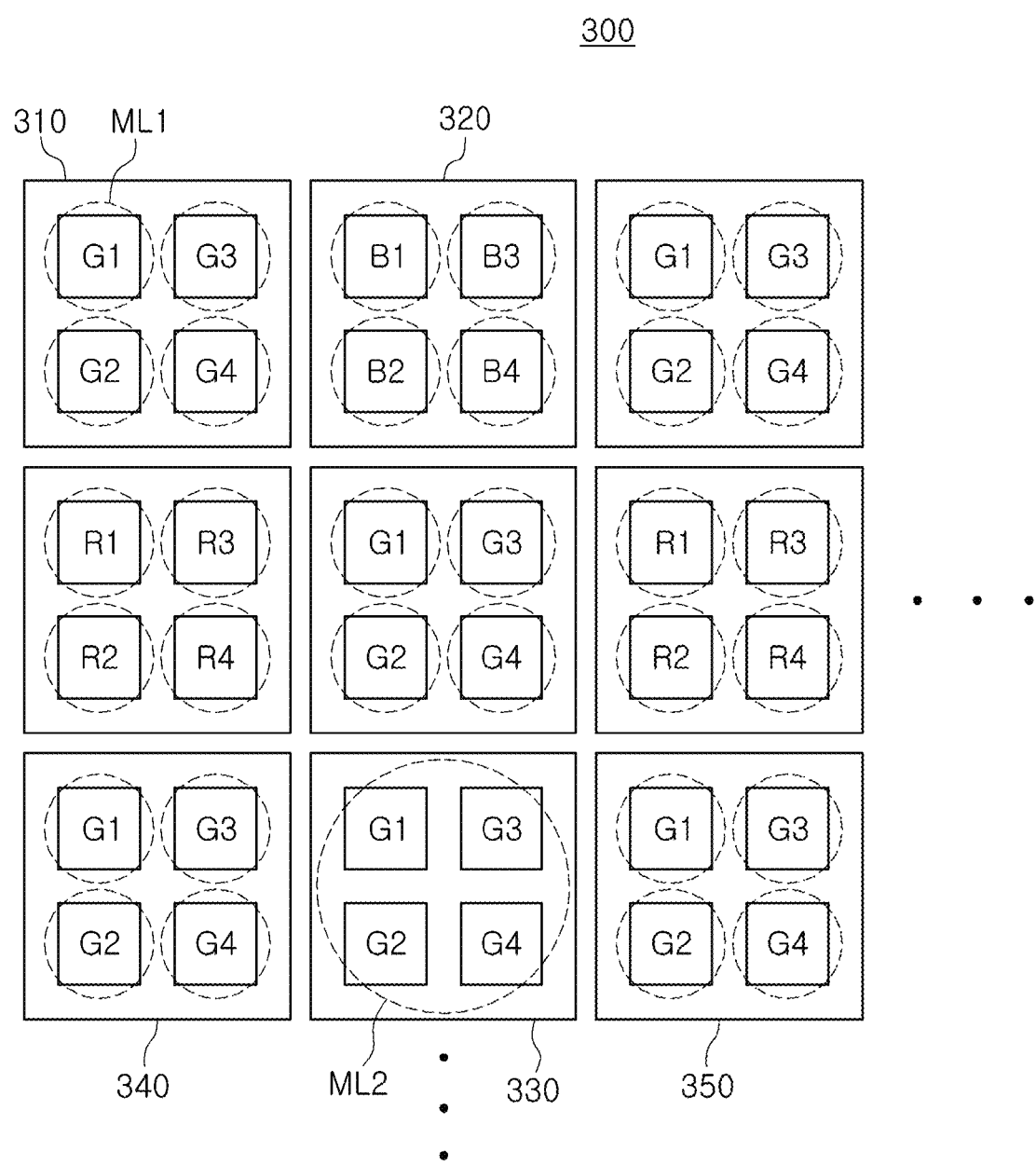
FIGS. 7A and 7B illustrate a pixel array according to an example embodiment.
Figure 7B:
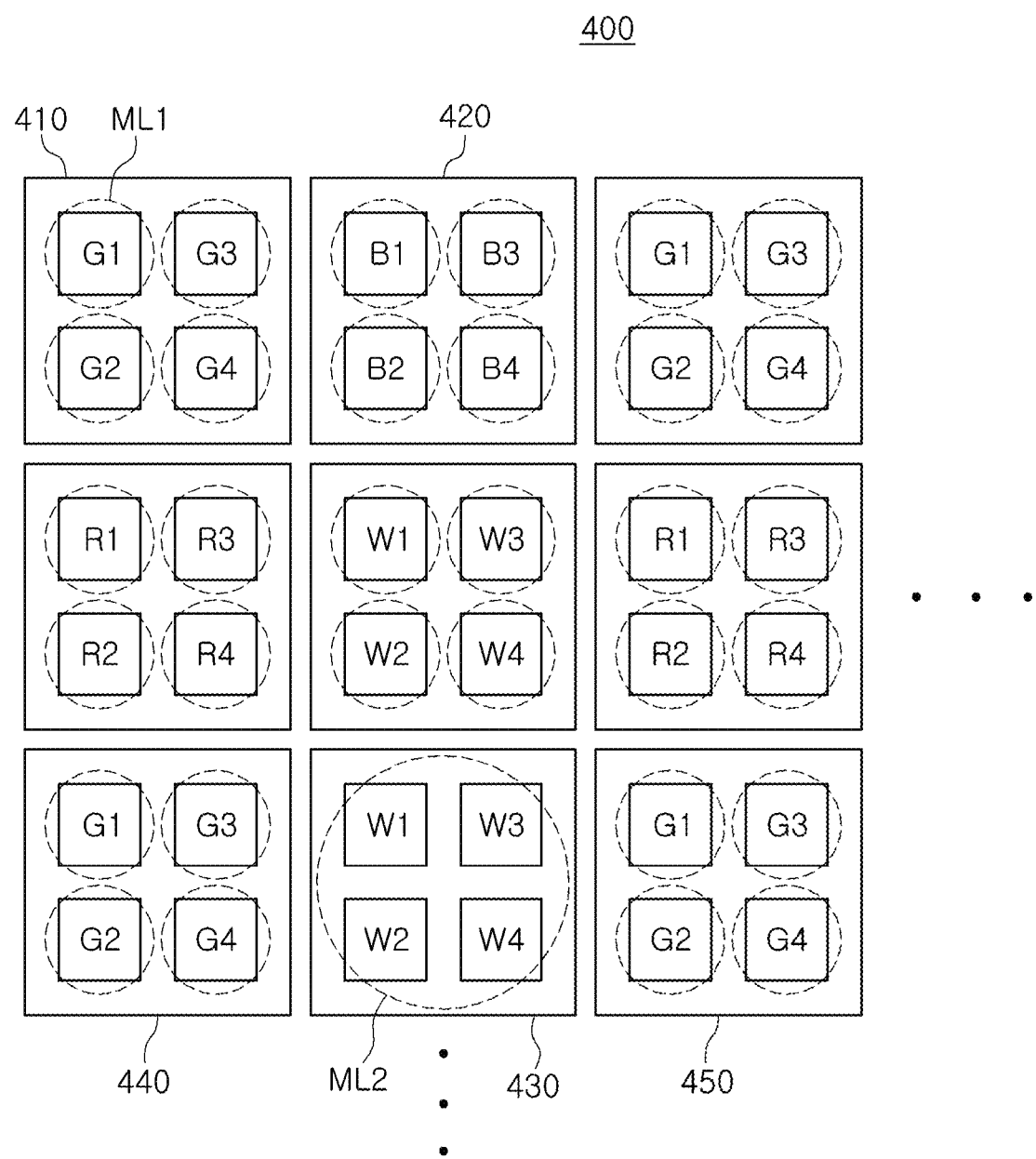

FIGS. 7A and 7B illustrate a pixel array according to an example embodiment.

Referring to FIG. 7A, a pixel array 300 may have a red-green-green-blue (RGGB) pattern. R1 to R4 may each refer to a red pixel, G1 to G4 may each refer to a green pixel, and B1 to B4 may each refer to a blue pixel.

The first to fourth unit pixels G1 to G4 adjacent to each other may constitute a first pixel group 310. When the first pixel group 310 is a normal pixel group, each of the first to fourth unit pixels G1 to G4 may include a green color filter and a microlens ML1. Each of the first to fourth unit pixels G1 to G4 may include at least one photodiode. The first to fourth unit pixels G1 to G4 may share at least one floating diffusion region.

The first to fourth unit pixels B1 to B4 adjacent to each other may constitute a second pixel group 320. When the second pixel group 320 is a normal pixel group, each of the first to fourth unit pixels B1 to B4 may include a blue color filter and a microlens ML1. Each of the first to fourth unit pixels B1 to B4 may include at least one photodiode. The first to fourth unit pixels B1 to B4 may share at least one floating diffusion region.

The first to fourth unit pixels G1 to G4 adjacent to each other may constitute a third pixel group 330. When the third pixel group 330 is an autofocusing pixel group, each of the first to fourth unit pixels G1 to G4 may include a green color filter. Each of the first to fourth unit pixels G1 to G4 may include at least one photodiode. The first to fourth unit pixels G1 to G4 may share at least one floating diffusion region. Each of the first to fourth unit pixels of the normal pixel group includes the microlens ML1, whereas the first to fourth unit pixels G1 to G4 of the autofocusing pixel group 330 may share a single microlens ML2.

In FIG. 7A, each of the first to fourth unit pixels G1 to G4 included in the third pixel group 330 is illustrated as including a green color filter. However, each of the first to fourth unit pixels G1 to G4, included in the third pixel group 330, may include one of a red color filter and a blue color filter. In addition, a portion of the first to fourth unit pixels G1 to G4, included in the third pixel group 330, may include different color filters to each other. For example, each of a portion of the first to fourth unit pixels G1 to G4, included in the third pixel group 330, may include a green color filter, and each of the other unit pixels may include a red color filter.

The third pixel group 330 may generate one image data among first image data (for example, left image data) or second image data (for example, right image data).

The microlens ML1 of the normal pixel group and the microlens ML2 of the autofocusing pixel group may have different characteristics. For example, a protruding height of the microlens ML1 and a protruding height of the microlens ML2 are the same, but a radius of curvature of the microlens ML1 and a radius of curvature of the microlens ML2 may be different from each other. According to example embodiments, the protruding height of the microlens ML1 and the protruding height of the microlens ML2 may be different from each other, and the radius of curvature of the microlens ML1 and the radius of curvature of the microlens ML2 may also be different from each other.

In an image sensor according to an example embodiment, when four adjacent pixels constitute an autofocusing pixel group, the autofocusing pixel group may include two autofocusing photodiodes and two drain photodiodes. The image sensor may generate first image data or second image data using electric charges generated from the two autofocusing photodiodes. Electric charges, generated from the two drain photodiodes, may be discharged to a drain terminal connected to the drain photodiodes.

Unlike the pixel array 300 of FIG. 7A, the pixel array 400 of FIG. 7B may have a red-green-blue-white (RGBW)

pattern. R1 to R4 may each refer to a red pixel, G1 to G4 may each refer to a green pixel, B1 to B4 may each refer to a blue pixel, and W1 to W4 may each refer to a white pixel.

First to fourth unit pixels W1 to W4 included in a third pixel group 330, an autofocusing pixel group, may each include a white color filter. However, an example embodiment is not limited thereto, and each of the first to fourth unit pixels W1 to W4, included in the third pixel group 330, may include one of a green color filter, a red color filter, and a blue color filter.

In addition, a portion of the first to fourth unit pixels W1 to W4, included in the third pixel group 330, may include different color filters to each other. For example, each of a portion of the first to fourth unit pixels W1-W4, included in the third pixel group 330, may include a green color filter, and each of the other unit pixels may include a white color filter.

Figure 8:
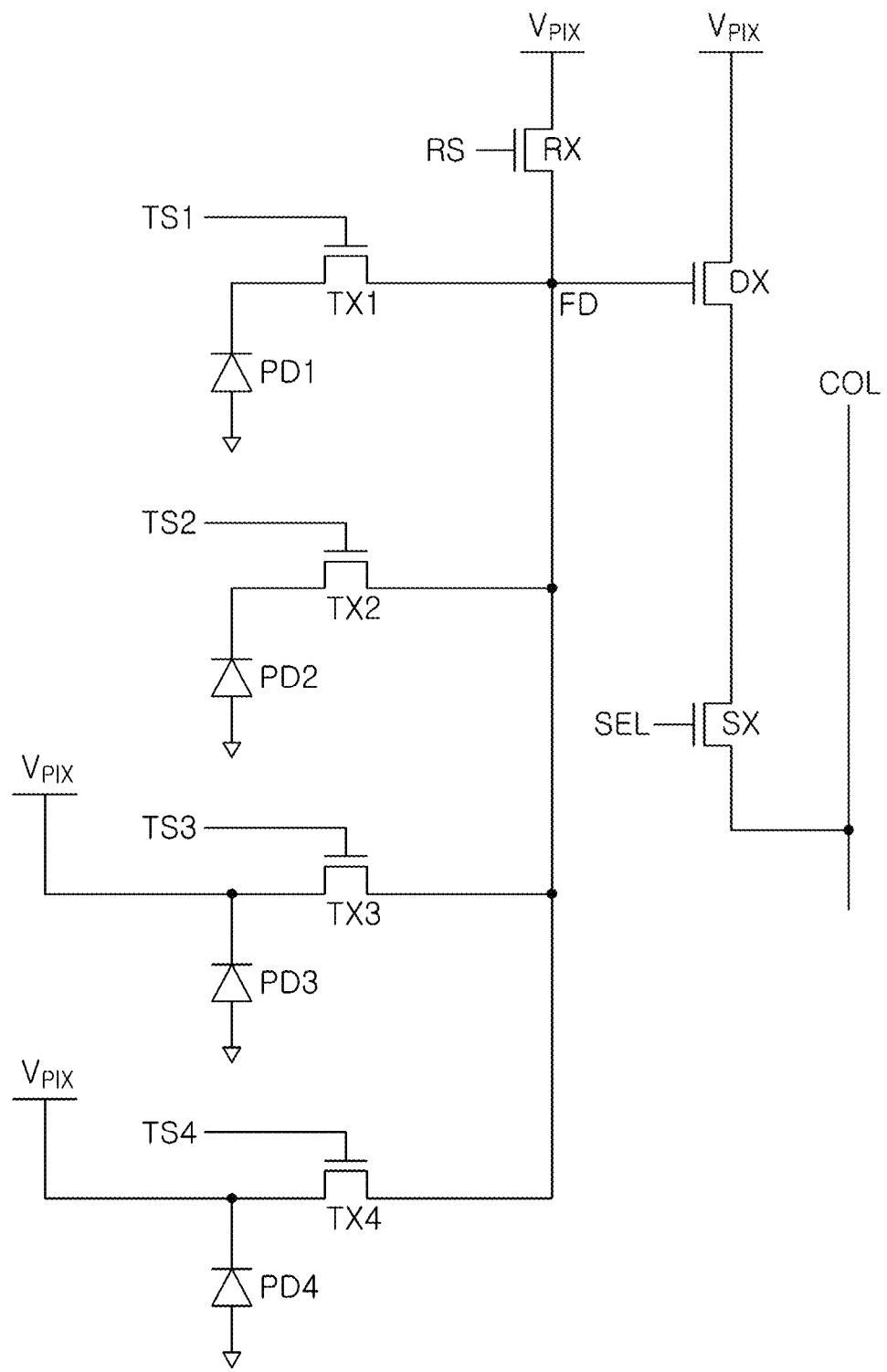
FIG. 8 is a schematic circuit diagram illustrating a pixel group according to an example embodiment.

FIG. 8 is a schematic circuit diagram illustrating a pixel group according to an example embodiment.

Referring to FIG. 8, a pixel group according to an example embodiment may include first to fourth photodiodes PD1 to PD4, first to fourth transfer transistors TX1 to TX4, a reset transistor RX, a driving transistor DX, and a select transistor SX. The first transfer transistor TX1 may be connected to the first photodiode PD1, and the second transfer transistor TX2 may be connected to the second photodiode PD2. The third transfer transistor TX3 may be connected to the third photodiode PD3, and the fourth transfer transistor TX4 may be connected to the fourth photodiode PD4. A first unit pixel including the first photodiode PD1, a second unit pixel including the second photodiode PD2, a third unit pixel including the third photodiode PD3, and a fourth unit pixel including a fourth photodiode PD4 may be shared by a single floating diffusion region FD.

A first transfer control signal TS1 may be a first turn-on signal for turning on the first transfer transistor TX1, and the first transfer transistor TX1 may be turned on in response to the first transfer control signal TS1. A second transfer control signal TS2 may be a second turn-on signal for turning on the second transfer transistor TX2, and the second transfer transistor TX2 is turned on in response to the second transfer control signal TS2. In contrast, a third transfer control signal TS3 may be a first turn-off signal for turning off the third transfer transistor TX3, and the third transfer transistor TX3 may be turned off in response to the third transfer control signal TS3. A fourth transfer control signal TS4 may be a second turn-off signal for turning off the fourth transfer transistor TX4, and the fourth transfer transistor TX4 may be turned off in response to the fourth transfer control signal TS4. For example, each of the first turn-off signal and the second turn-off signal may be a ground voltage.

In FIG. 8, four photodiodes and four transfer gate electrodes are illustrated and described as being separated from each other. However, at least two photodiodes may be connected to each other to constitute a single photodiode, and at least two transfer gate electrodes may be connected to each other to constitute a single transfer gate electrode.

When the pixel group illustrated in FIG. 8 is an autofocusing pixel group, the pixel group may include two autofocusing photodiodes PD1 and PD2 and two drain photodiodes PD3 and PD4. The image sensor may generate first image data or second image data using electric charges generated from the two autofocusing photodiodes PD1 and PD2. The image sensor may discharge electric charges, generated from the drain photodiodes PD3 and PD4, to drain terminals connected to the drain photodiodes.

Specifically, the image sensor may simultaneously turn on the first and second transfer transistors TX1 and TX2. When the first and second transfer transistors TX1 and TX2 are simultaneously turned on, electric charges output from the first and second photodiodes PD1 and PD2 may be summed in the floating diffusion region FD.

When the select transistor SX is then turned on in response to the selection control signal SEL, a read-out circuit may detect a pixel voltage corresponding to the amount of the electric charges, summed in the floating diffusion region FD, through a column line COL.

The image sensor may turn off the third and fourth transfer transistors TX3 and TX4. The image sensor may apply a power supply voltage $V_{PIX}$ to the third photodiode PD3 between the third photodiode PD3 and the third transfer transistor TX3. In addition, the image sensor may apply the power supply voltage $V_{PIX}$ to the fourth photodiode PD4 between the fourth photodiode PD4 and the fourth transfer transistor TX4. In this application, although the power supply voltage $V_{PIX}$ is illustrated and described as being applied to the third photodiode PD3 and the fourth photodiode PD4, a constant voltage or a positive (+) voltage may be applied to the third photodiode PD3 and the fourth photodiode PD4. As the power supply voltage $V_{PIX}$ is applied to the third photodiode PD3 and the fourth photodiode PD4, electric charges output from each of the third and fourth photodiodes PD3 and PD4 may be limited and/or prevented from migrating to the floating diffusion region FD.

Figure 9A:
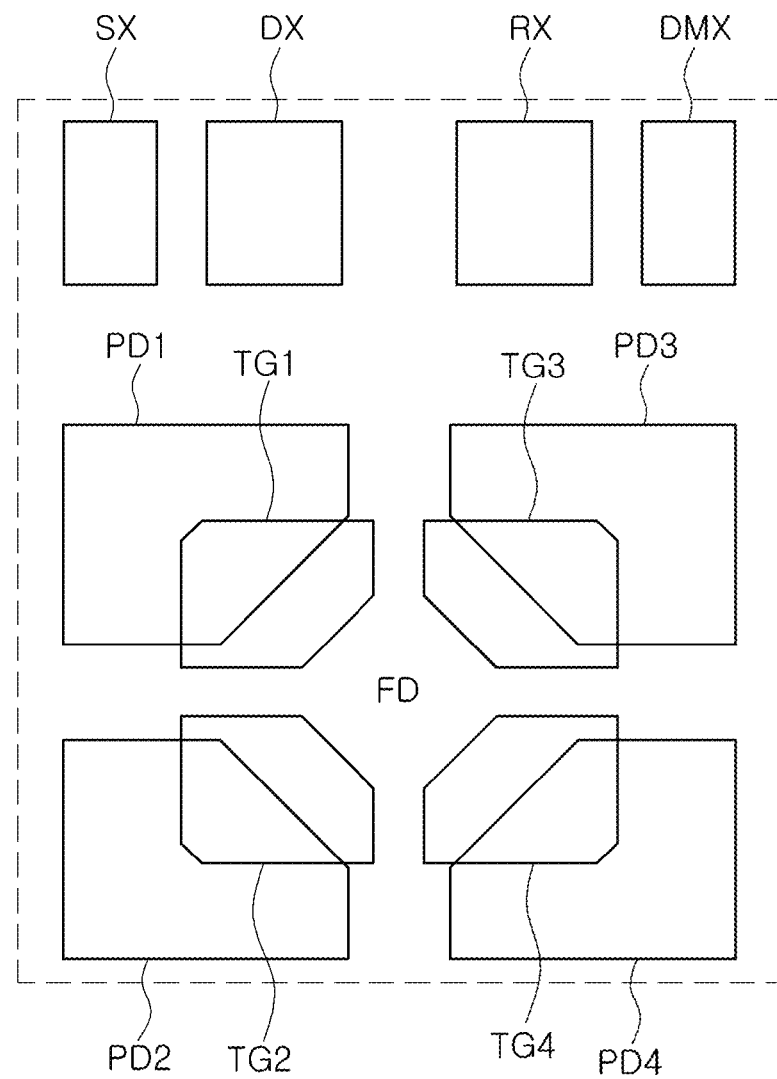
FIG. 9A is a plan view of a normal pixel group according to an example embodiment.

FIG. 9A is a plan view of a normal pixel group according to an example embodiment. The pixel group of FIG. 9A may be one of the pixel groups 310 to 350 of FIG. 7A.

Referring to FIG. 9A, a pixel group PG may include first to fourth photodiodes PD1 to PD4, first to fourth transfer gate electrodes TG1 to TG4, a select transistor SX, a driving transistor DX, a reset transistor RX, and a dummy transistor DMX. The first to fourth photodiodes PD1 to PD4 may share a floating diffusion region FD.

The first transfer gate electrode TG1 may be a gate electrode of the first transfer transistor TG1 connected to the first photodiode PD1, and the second transfer gate electrode TG2 may be a gate electrode of the second transfer transistor TG2 connected to the second photodiode PD2. The third transfer gate electrode TG3 may be a gate electrode of the third transfer transistor TG3 connected to the third photodiode PD3, and the fourth transfer gate electrode TG4 may be a gate electrode of the second transfer transistor TG4 connected to the four photodiode PD4.

The pixel group PG may share the select transistor SX, the driving transistor DX, the reset transistor RX, and the dummy transistor DMX.

The dummy transistor DMX may be used to separate a node of the floating diffusion region FD and a charge output node of an adjacent pixel group from each other. According to example embodiments, a device isolation layer such as shallow trench isolation (STI) may be used instead of the dummy transistor DMX. According to an example embodiment, the node of the floating diffusion region FD and the charge output node of the adjacent pixel group may be isolated from each other using a PN junction rather than the dummy transistor DMX. For example, the node of the floating diffusion region FD may be doped with n-type, and the active region of the charge output node of the adjacent pixel group may also be doped with n-type. Therefore, p-type impurities may be introduced between the node of the floating diffusion region FD and the charge output node of the adjacent pixel group to isolate the node of the floating diffusion region FD and the charge output node of the adjacent pixel group.

In FIG. 9A, four photodiodes and four transfer gate electrodes are illustrated and described as being separated from each other. However, at least two photodiodes may be connected to each other to constitute a single photodiode, and at least two transfer gate electrodes may be connected to each other to constitute a single transfer gate electrode. When at least two transfer gate electrodes are connected to each other to constitute a single transfer gate electrode, the number of contacts connected to the transfer gate electrode may be decreased.

According to a first embodiment, a pixel group PG may have a first structure in which the first transfer gate electrode TG1 and the second transfer gate electrode TG2 are connected to each other to constitute a single transfer gate electrode, and the third transfer gate electrode and the fourth transfer gate electrode TG4 are connected to each other to constitute a single transfer gate electrode. Alternatively, the pixel group PG may have a second structure in which the first photodiode PD1 and the second photodiode PD2 are connected to each other to constitute a single photodiode, and the third photodiode PD3 and the fourth photodiode PD4 are connected to each other to constitute a single photodiode. Alternatively, the pixel group PG may have both the first structure and the second structure.

According to a second embodiment, the pixel group PG may have a third structure in which the first transfer gate electrode TG1 and the third transfer gate electrode TG3 are connected to each other to constitute a single transfer gate electrode, and the second transfer gate electrode TG2 and the fourth transfer gate electrode TG4 are connected to each other to constitute a single transfer gate electrode. Alternatively, the pixel group PG connects the first photodiode PD1 and the third photodiode PD3 to constitute a single photodiode and connects the second photodiode PD2 and the fourth photodiode PD4. The fourth structure may be connected to constitute a single photodiode. Alternatively, the pixel group PG may have both the third structure and the fourth structure.

According to the first embodiment, when the pixel group PG is an autofocusing pixel group, the pixel group PG may obtain autofocusing information from left and right photodiodes. According to the second example embodiment, when the pixel group PG is an autofocusing pixel group, the pixel group PG may obtain autofocusing information from upper and lower photodiodes.

According to a third embodiment, when the pixel group PG is a normal pixel group, the pixel group PG may have a fifth structure. In the fifth structure, a first transfer gate electrode TG1, a second transfer gate electrode TG2, a third transfer gate electrode TG3, and the fourth transfer gate electrode TG4 are connected to each other to constitute a single transfer gate electrode, and a first photodiode PD1, a second photodiode PD2, a third photodiode PD3, and the fourth photodiode PD4 are connected to each other to constitute a single photodiode.

According to the third embodiment, the image sensor may detect only a pixel voltage corresponding to the amount of summed electric charges output from the first to fourth photodiodes PD1 to PD4.

Figure 9B:
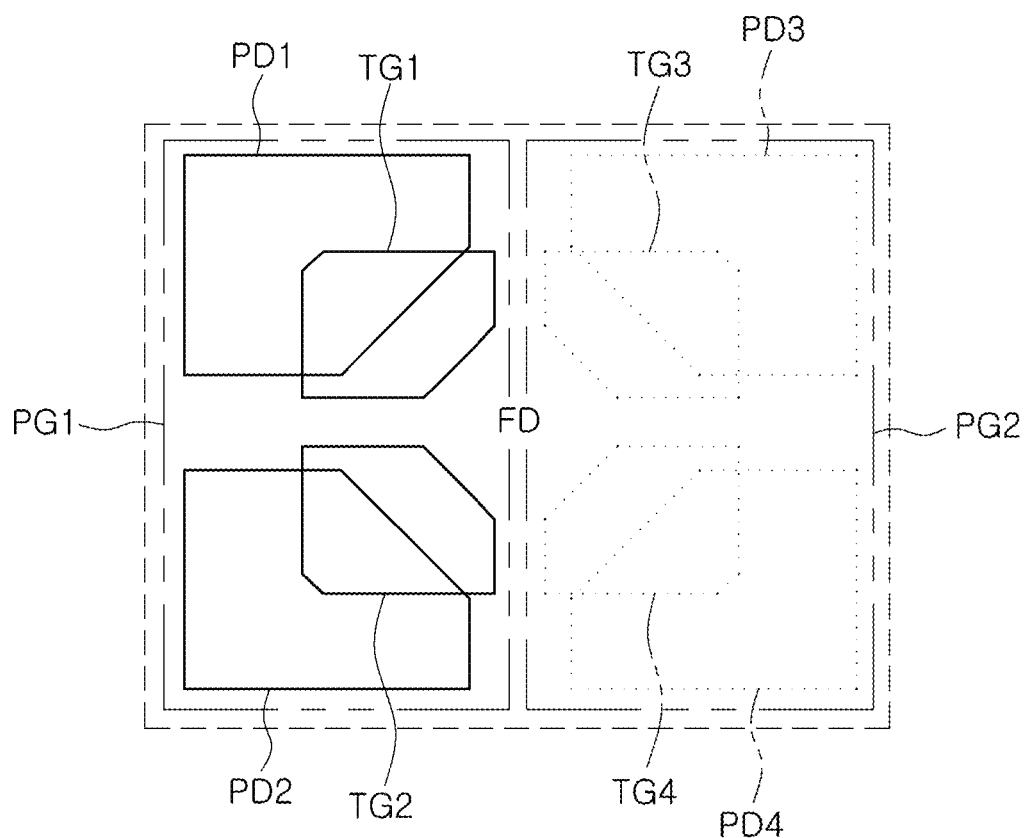
FIGS. 9B and 9C are plan views of autofocusing pixel groups according to an example embodiment, respectively.
Figure 9C:
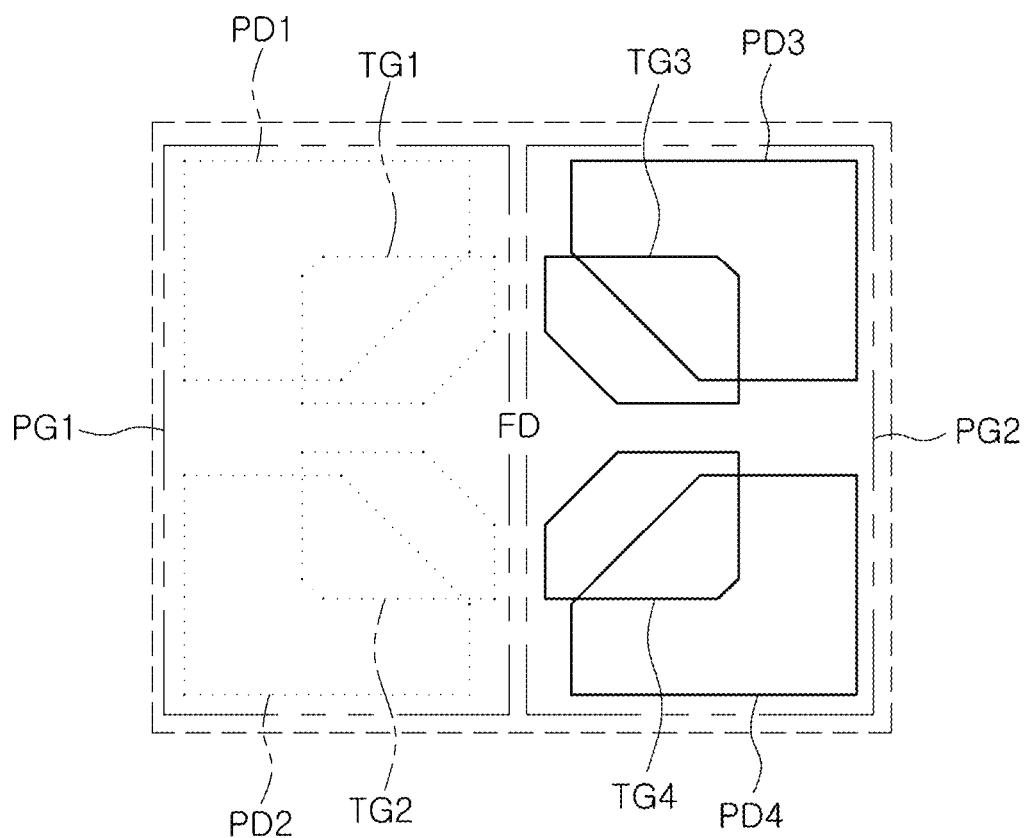

FIGS. 9B and 9C are plan views of autofocusing pixel groups according to an example embodiment, respectively. The autofocusing pixel groups of FIGS. 9B and 9C will be described while focusing on differences from the normal pixel group of FIG. 9A. An autofocusing pixel group according to an example embodiment may include a first pixel area and a second pixel area. A first photodiode PD1 included in a first unit pixel and a second photodiode PD2 included in a second unit pixel may constitute a first photodiode group PG1 in the first pixel area. A third photodiode PD3 included in a third unit pixel and a fourth photodiode PD4 included in a fourth unit pixel may constitute a second photodiode group PG2 in the second pixel area.

Specifically, referring to FIG. 9B, an autofocusing pixel group 330a may generate first image data (for example, left image data). In this case, the autofocusing pixel group 330a may obtain first image data using electric charges output from the first photodiode PD1 and the second photodiode PD2 included in the first photodiode group PG1. The first photodiode PD1 and the second photodiode PD2 may be an autofocusing photodiode group.

Electric charges, output from the third photodiode PD3 and the fourth photodiode PD4 included in the second photodiode group PG2, may be discharged to at least one drain terminal. The at least one drain terminal may be connected to the third photodiode PD3 and the fourth photodiode PD4. The third photodiode PD3 and the fourth photodiode PD4 may be a drain photodiode group.

Referring to FIG. 9C, an autofocusing pixel group 330b may generate second image data (for example, right image data). In this case, the autofocusing pixel group 330b may obtain second image data using electric charges output from the third photodiode PD3 and the fourth photodiode PD4 included in the second photodiode group PG2. The third photodiode PD3 and the fourth photodiode PD4 may be an autofocusing photodiode group.

Electric charges, output from the first photodiode PD1 and the second photodiode PD2 included in the first photodiode group PG1, may be discharged to at least one drain terminal. The at least one drain terminal may be connected to the first photodiode PD1 and the second photodiode PD2. The first photodiode PD1 and the second photodiode PD2 may be a drain photodiode group.

The image sensor may perform an autofocusing function using the first image data and the second image data generated from the autofocusing pixel groups 330a and 330b.

Since a structure and an operation of the autofocusing pixel group for generating the first image data are similar to those of the autofocusing pixel group for generating the second image data, examples of an autofocusing pixel for generating the second image data will now be described.

FIGS. 10A to 10F illustrate an operation of an autofocusing pixel group according to an example embodiment.

Figure 10A:
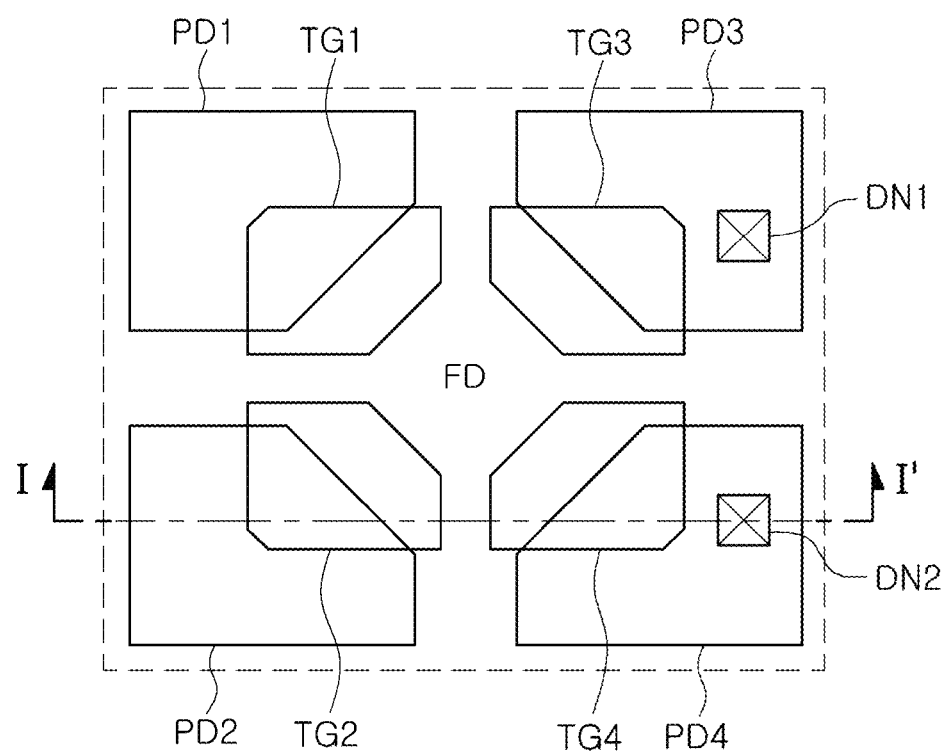
FIGS. 10A to 10F illustrate an operation of an autofocusing pixel group according to an example embodiment.
Figure 10B:
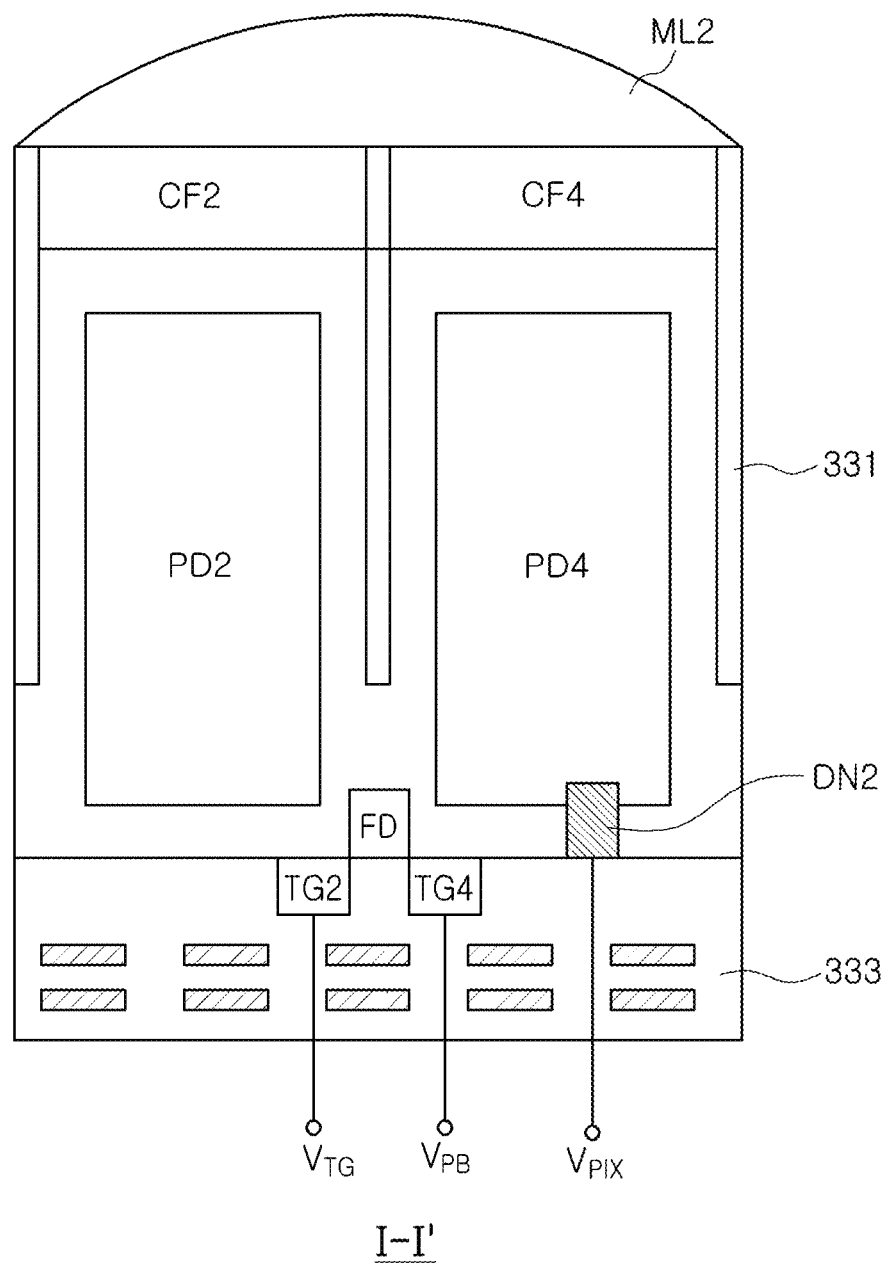
Figure 10C:
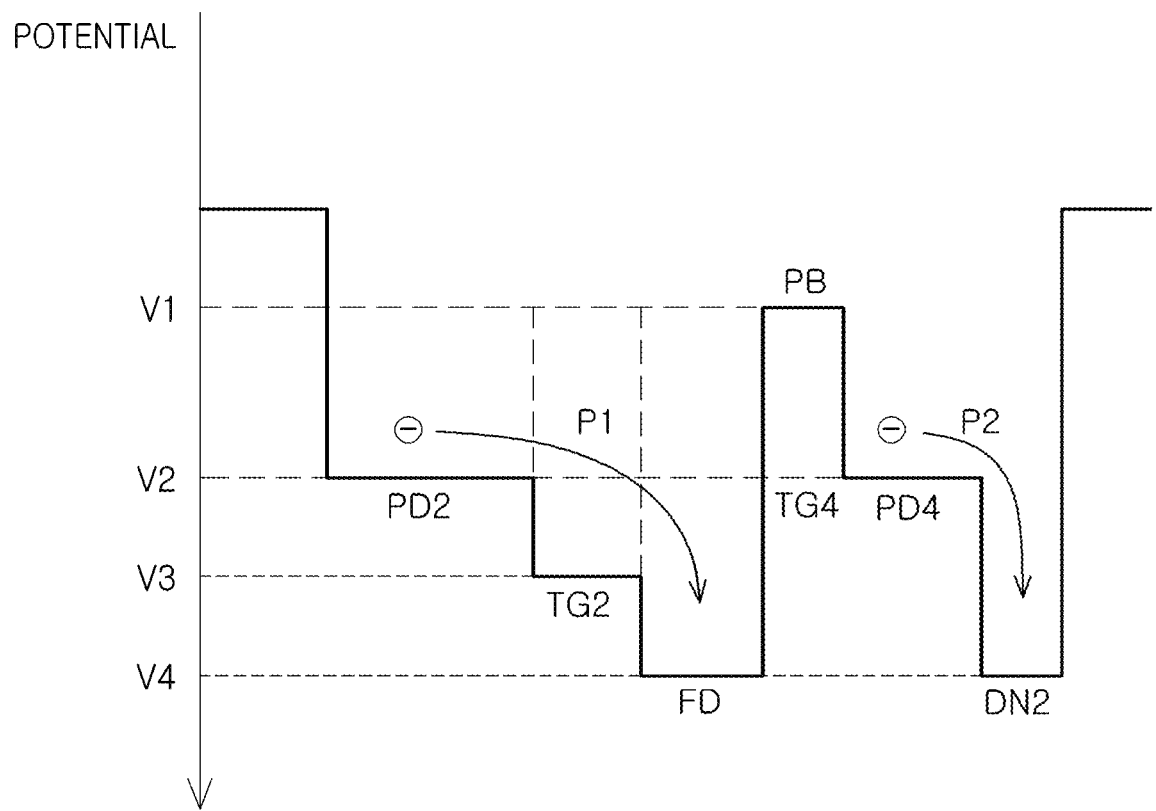
Figure 10D:
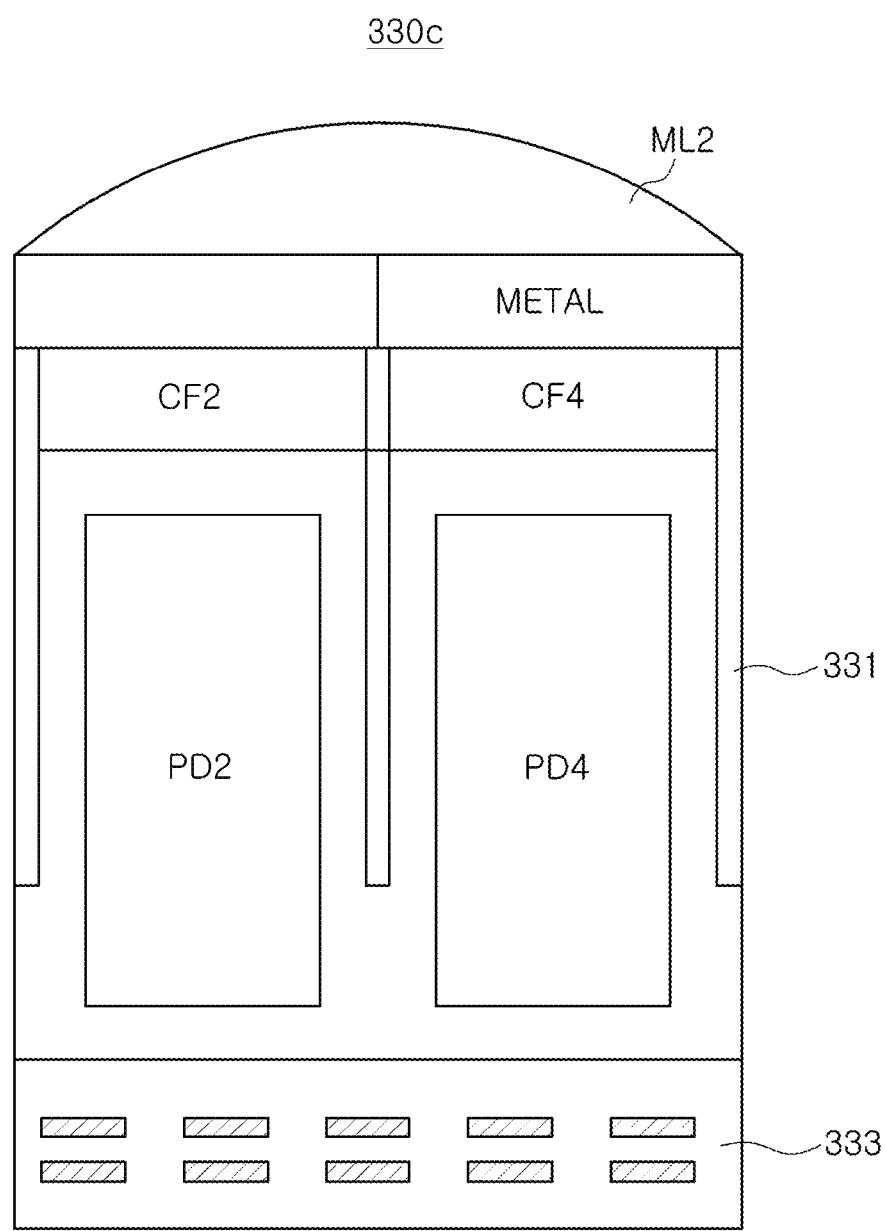
Figure 10E:
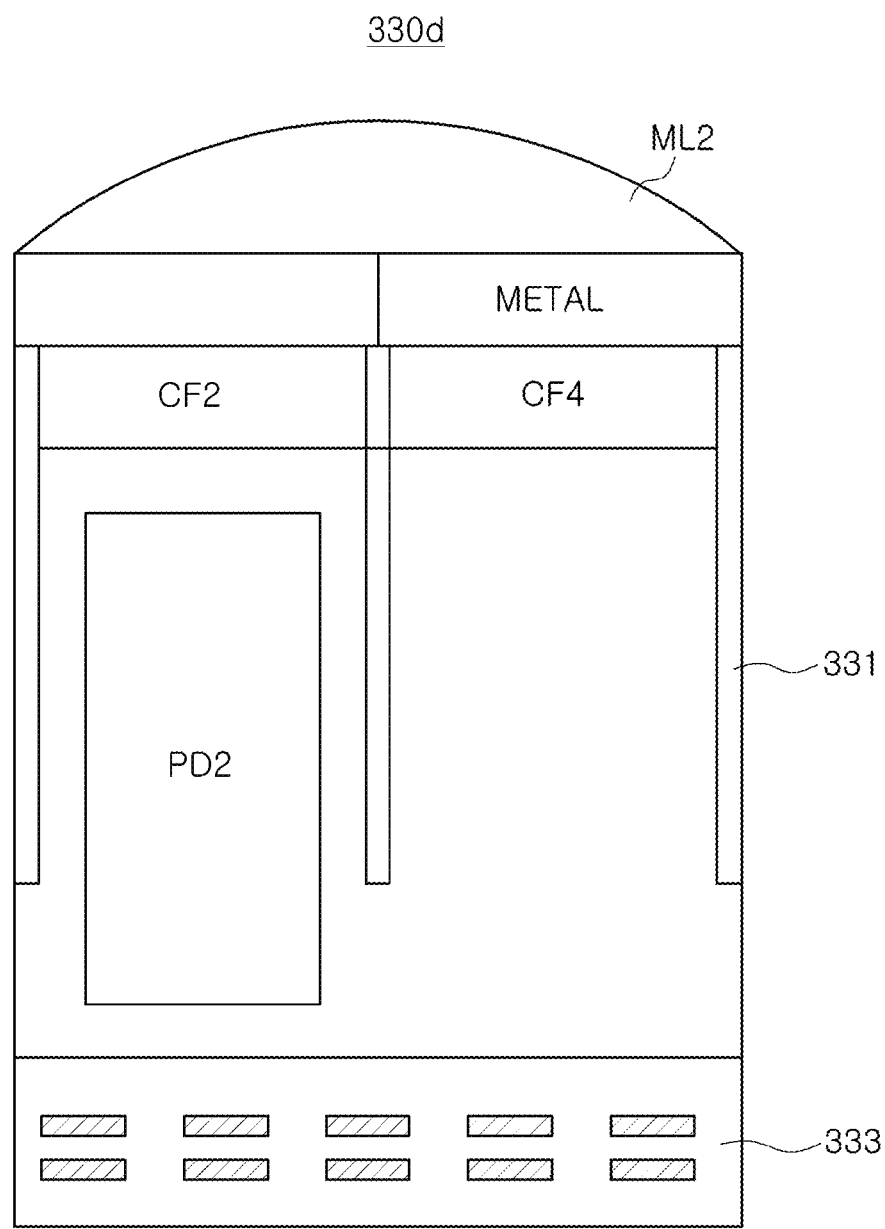
Figure 10F:
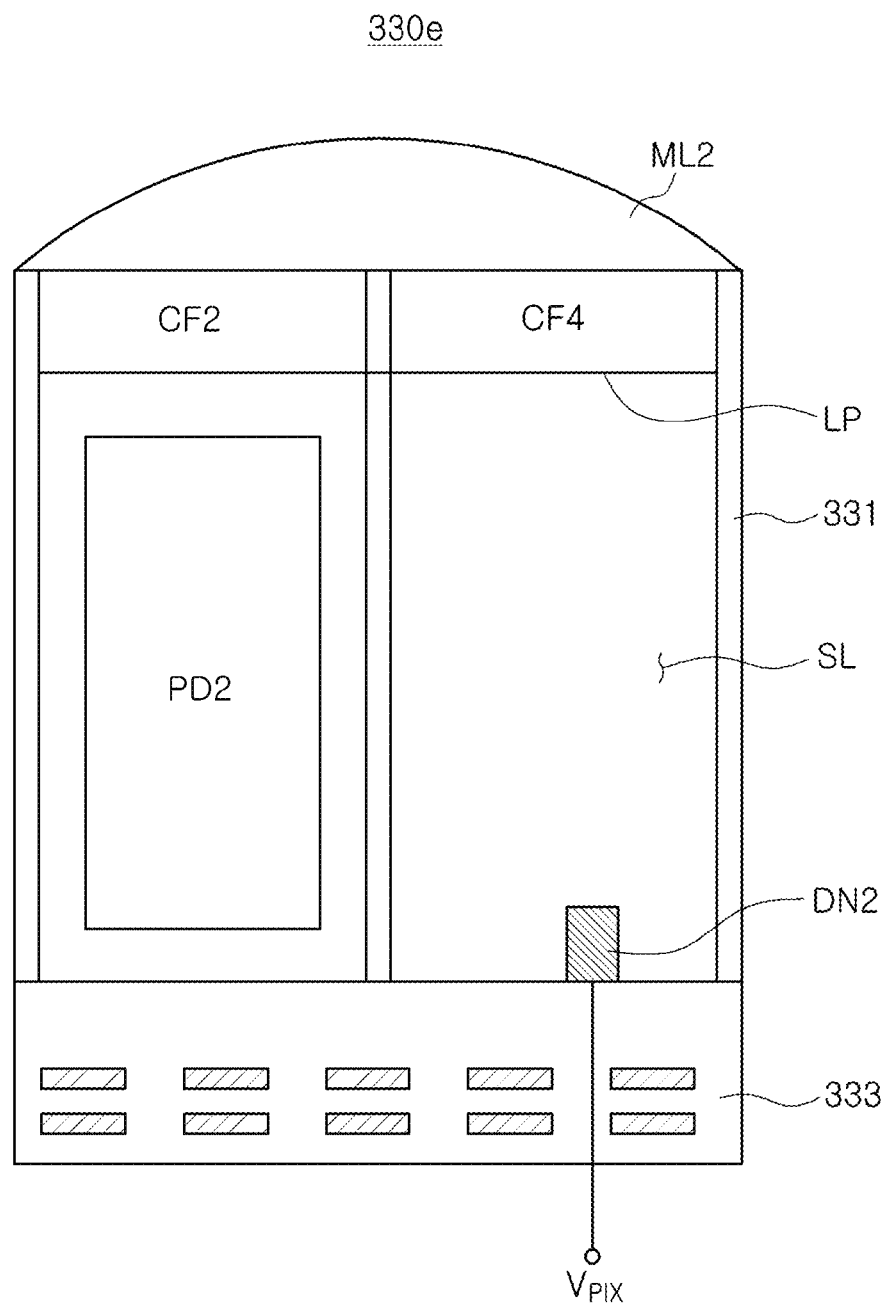

FIG. 10A is a plan view of an autofocusing pixel group according to an example embodiment, FIG. 10B is a cross-sectional view taken along line I-I' in FIG. 10A, FIG. 10C illustrates a potential level of an image sensor in a photonic integration mode according to an example embodiment, and FIGS. 10D to 10F are cross-sectional views illustrating portions of an autofocusing pixel group according to an example embodiment.

Referring to FIG. 10A, an autofocusing pixel group 330-1 may include a first photodiode PD1 and a second photodiode PD2 formed in a first pixel area, a third photodiode PD3 and a fourth photodiode PD4 formed in a second pixel area, a first drain terminal DN1 connected to the third photodiode PD3, and a second drain terminal DN2 connected to the fourth photodiode PD4. The first to fourth photodiodes PD1 to PD4 may be doped with n-type, and the first drain terminal DN1 and the second drain terminal DN2 may be doped with n-type.

Referring to FIG. 10B, an autofocusing pixel group 330-1 may include a second photodiode PD2, a second color filter CF2 disposed on the second photodiode PD2, a fourth photodiode PD4, a fourth color filter CF4 disposed on the fourth photodiode PD4, a device isolation layer 331, a pixel circuit 333, a floating diffusion region FD, and a second drain terminal DN2.

The device isolation layer 331 may electrically isolate the first pixel area and the second pixel area. For example, the device isolation layer 331 may electrically isolate the second photodiode PD2 and the fourth photodiode PD4 disposed adjacent to each other. The floating diffusion region FD may store electric charges generated by each of the second photodiode PD2 and the fourth photodiode PD4. The pixel circuit 333 may include a second transfer gate electrode TG2, a fourth transfer gate electrode TG4, and metal interconnections.

A transfer control signal VTG may be input to the second transfer gate electrode TG2 of the second transfer transistor connected to the second photodiode PD2 in the first pixel area. Thus, the second transfer transistor may be turned on. As the second transfer transistor is turned on, electric charges generated in the second photodiode PD2 may be discharged to the floating diffusion region FD.

A barrier voltage $V_{PB}$ may be applied to the fourth transfer gate electrode TG4 of the fourth transfer transistor connected to the fourth photodiode PD4 in the second pixel area. The barrier voltage may refer to a voltage for forming a sufficient potential barrier between the fourth photodiode PD4 and the floating diffusion region FD. A power supply voltage $V_{PIX}$ may be input to the second drain terminal DN2 of the second pixel area from a power supply node. As the power supply voltage VPIX is input to the second drain terminal DN2, electric charges generated by the fourth photodiode PD4 may be discharged to the second drain terminal DN2. For example, the electric charges generated in the fourth photodiode PD4 by the power supply voltage $V_{PIX}$ may not migrate to the floating diffusion region FD due to the potential barrier, and may migrate to the power supply node.

Referring to FIG. 10C, a potential level is a negative potential in an upward direction and a positive potential in a downward direction. The potential level may be decreased in the upward direction and may be increased in the downward direction.

Referring to both FIGS. 10B and 10C, when a barrier voltage is applied to the fourth transfer gate electrode TG4 to form a sufficient potential barrier between the fourth photodiode PD4 and the floating diffusion region FD, a channel region below the fourth transfer gate electrode TG4 may have a first potential level V1. Each of the second photodiode PD2 and the fourth photodiode PD4 may have a second potential level V2. When the second transfer transistor is turned on, the channel region below the second transfer gate electrode TG2 may have a third potential level V3. Each of the floating diffusion region FD and the second drain terminal DN2 may have a fourth potential level V4. A potential level of the floating diffusion region FD and a potential level of the second drain terminal DN2 may be different from each other.

The first potential level V1 may be lower than the second potential level V2, the second potential level V2 may be lower than the third potential level V3, and the third potential level V3 may be lower than the fourth potential level V4.

Electric charges (−), generated in the second photodiode PD2 due to a difference between a potential level of the second photodiode PD2 and a potential level of the channel region below the second transfer gate electrode TG2, may migrate to the floating diffusion region FD through a first path P1.

However, a potential barrier PB may be provided between the fourth photodiode PD4 and the floating diffusion region FD due to the difference between a potential level of the fourth photodiode PD4 and a potential level of the channel region below the fourth transfer gate electrode TG4. Therefore, electric charges (−) generated in the fourth photodiode PD4 may not migrate to the floating diffusion region FD and may be discharged to the second drain terminal DN2 through a second passage P2.

According to an example embodiment, the autofocusing pixel group 330 of FIG. 10A may not include the third transfer gate electrode TG3 and the fourth transfer gate electrode TG4. When a potential barrier between the third photodiode PD3 and the floating diffusion region FD and a potential barrier between the fourth photodiode PD4 and the floating diffusion region FD are formed to be sufficiently high, electric charges generated in the third photodiode PD3 and the fourth photodiode PD4 may not migrate to the floating diffusion region FD and may be discharged to the drain terminals DN1 and DN2 even the case in which a third transfer gate electrode and a third transfer gate electrode are not provided.

Referring to FIG. 10D, unlike the autofocusing pixel groups 330-1 of FIGS. 10A to 10C, an autofocusing pixel group 330c of FIG. 10D has a second pixel region in which at least one of a third unit pixel and a fourth unit pixel may not have a drain terminal. For example, the fourth unit pixel may not have a drain terminal. Instead, a metal may be further provided between a fourth color filter CF4 of the fourth unit pixel and a microlens ML2. Light, incident on the fourth photodiode PD4, may be blocked by the metal. Thus, the autofocusing pixel group may generate image data for performing an autofocusing function even when the fourth unit pixel does not have a drain terminal.

Unlike the autofocusing pixel group 330c of FIG. 10D, an autofocusing pixel group 330d of FIG. 10E has a second pixel area which may not include at least one of a third photodiode and a fourth photodiode. For example, the second pixel area may not include a fourth photodiode PD4.

Unlike an autofocusing pixel group 330d of FIG. 10E, an autofocusing pixel group 330e of FIG. 10F is an autofocusing pixel group in which a metal, or the like, may not be provided between a microlens ML2 and a fourth color filter CF4 of a fourth unit pixel. Instead, the fourth unit pixel of the second pixel area may further have a drain terminal DN2. A power supply voltage may be applied to the drain terminal DN2. A device isolation layer 331 may physically completely isolate the second unit pixel and the fourth unit pixel from each other.

The device isolation layer 331 may refer to a DTI region extending (or formed) from a first surface (or a lower portion) of a semiconductor substrate SL in a vertical direction. In addition, the device isolation layer 331 may refer to a DTI formed in a process of manufacturing a backside illuminated (BSI) image sensor. The device isolation layer 331 may prevent crosstalk between one pixel and another pixel.

When the semiconductor substrate SL of the fourth unit pixel is formed of silicon, electric charges may be generated in the semiconductor substrate SL of the fourth unit pixel by light. Since the device isolation layer 331 may physically completely isolate one pixel from another pixel, the electric charges generated in the semiconductor substrate SL of the fourth unit pixel by light may not migrate to an adjacent second unit pixel and may be discharged to the second drain terminal DN2.

As described with reference to FIGS. 10A to 10D, the number of photodiodes included in the second pixel area may be the same as the number of photodiodes included in the first pixel area. According to an example embodiment, as described with reference to FIGS. 10E and 10F, the number of photodiodes included in the second pixel area may be smaller than the number of photodiodes included in the first pixel area. According to an example embodiment, the second pixel area may not include a photodiode.

In FIGS. 10A to 10D, a single pixel group has been illustrated and described as including two autofocusing photodiodes and two drain photodiodes. However, a single pixel group may include at least one autofocusing photodiode and at least one drain photodiode.

Figure 11A:
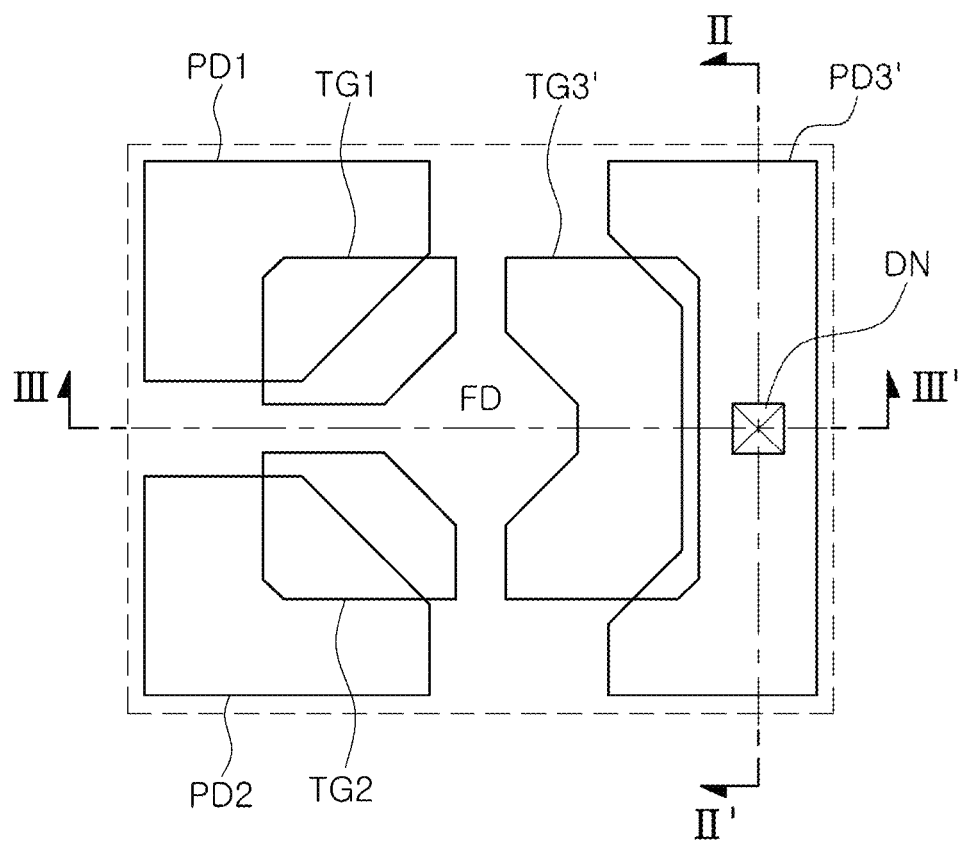
FIG. 11A is a plan view of an autofocusing pixel group according to an example embodiment.
Figure 11B:
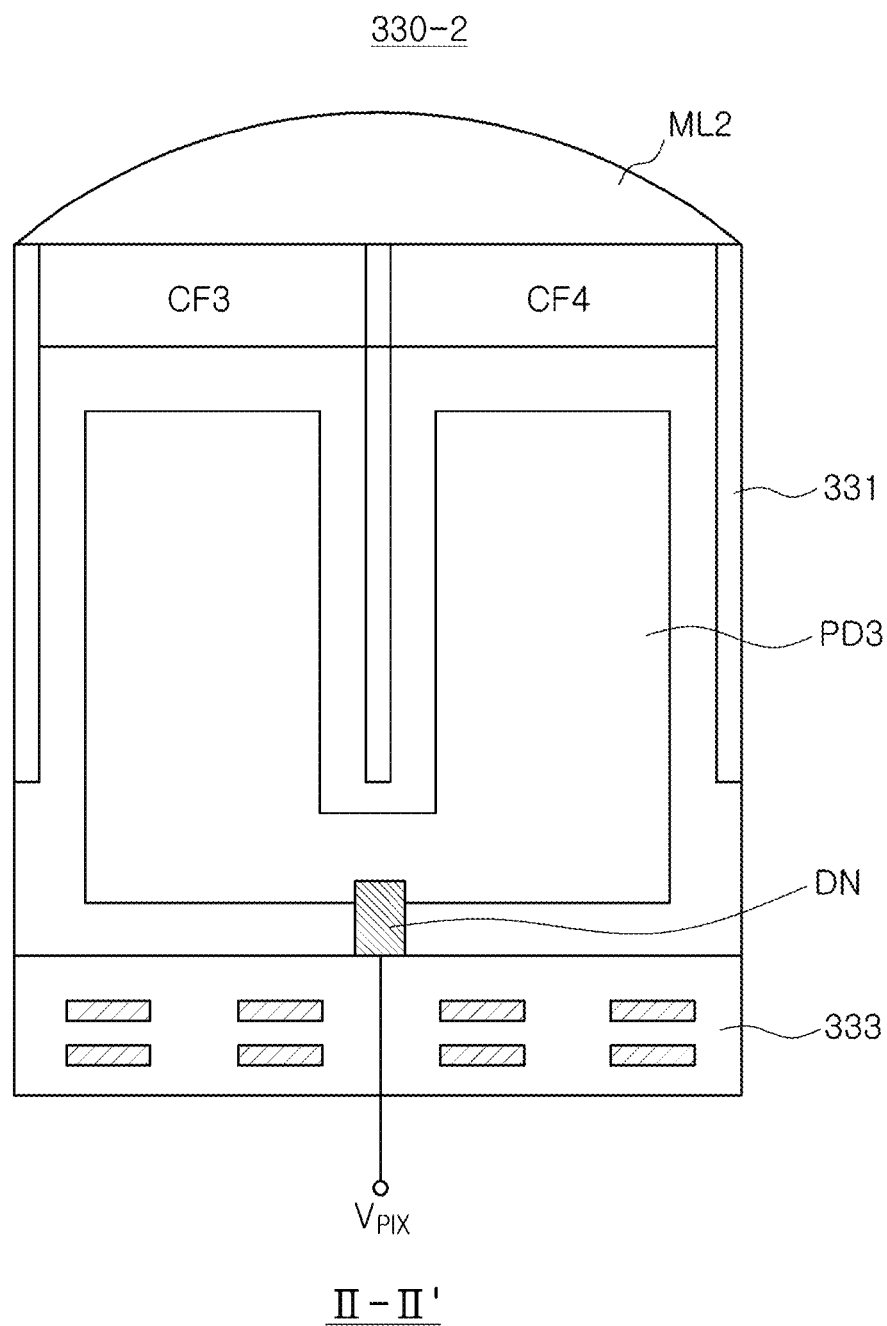
Figure 11C:
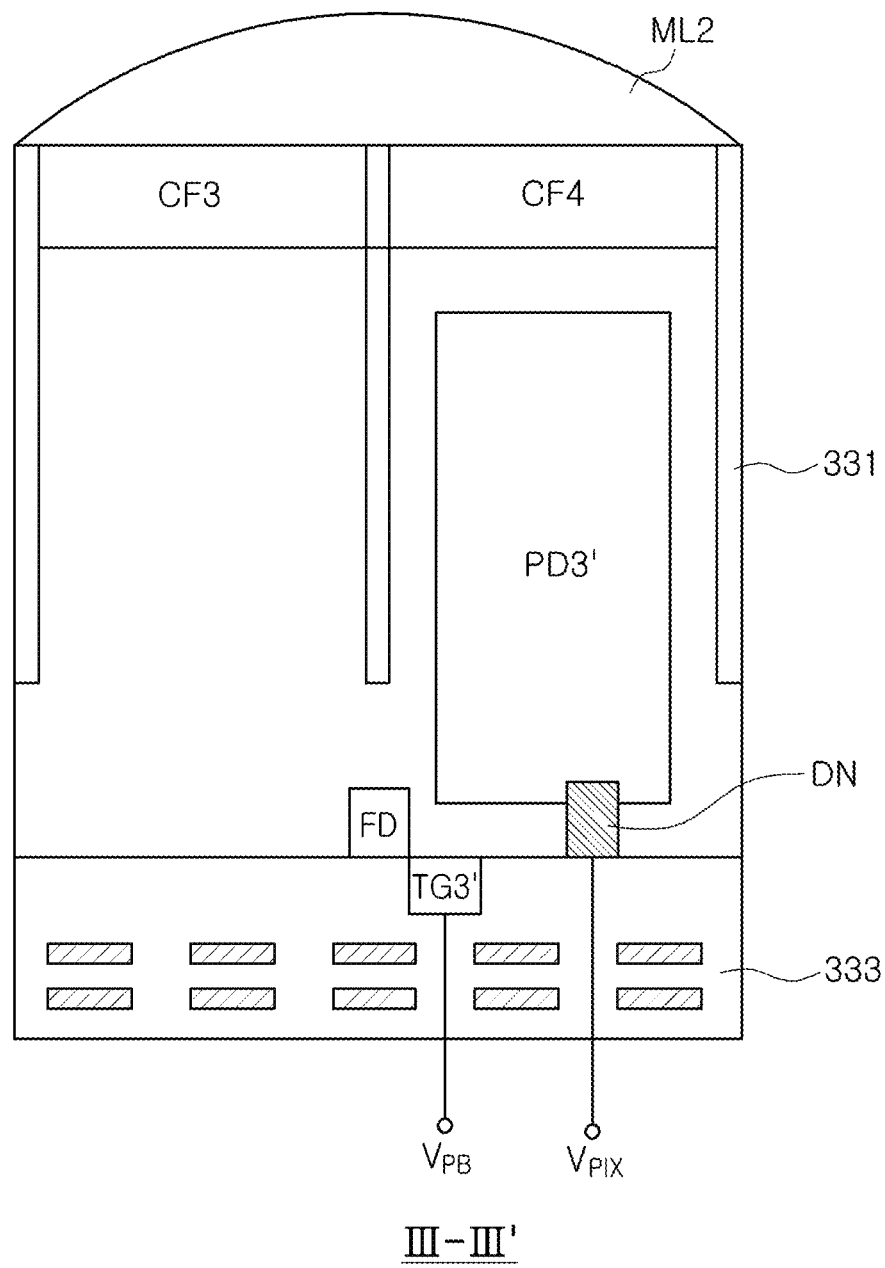
FIG. 11C is a cross-sectional view taken along line III-III' in FIG. 11A.

FIG. 11A is a plan view of an autofocusing pixel group according to an example embodiment, FIG. 11B is a cross-sectional view taken along line II-IT in FIG. 11A, and FIG. 11C is a cross-sectional view taken along line III-III' in FIG. 11A.

Unlike the autofocusing pixel group 330-1 of FIG. 11A, an autofocusing pixel group 330-2 of FIG. 11A is an autofocusing pixel group in which a third transfer gate electrode TG3 and a fourth transfer gate electrode TG4 may be connected to each other to constitute a single transfer gate electrode TG3'. In addition, a third photodiode PD3 and a fourth photodiode PD4 may be connected to each other to constitute a single photodiode PD3'. A single drain terminal DN may be connected to the photodiode PD3'.

The photodiode PD3' may have a shape different from a shape of each of the first photodiode PD1 and the second photodiode PD2. In addition, the photodiode PD3' may have an area different from an area of each of the first photodiode PD1 and the second photodiode PD2. For example, the photodiode PD3' may have an area larger than an area of each of the first photodiode PD1 and the second photodiode PD2. In this case, a light receiving area of the photo gate electrode TG3' may be larger than a light receiving area of each of the first photodiode PD1 and the second photodiode PD2.

Referring to FIG. 11B, the third photodiode PD3 and the fourth photodiode PD4 may be connected to each other to constitute a single photodiode PD3', and a single drain terminal DN may be connected to the photodiode PD3'. A power supply voltage $V_{PIX}$ may be input to the drain terminal DN. As the power supply voltage $V_{PIX}$ is input to the drain terminal DN, electric charges generated by the photodiode PD3' may be discharged to the drain terminal DN.

Referring to FIG. 11C, the transfer gate electrode TG3' may be disposed between a floating diffusion region FD and the drain terminal DN. The floating diffusion region FD may be doped with n$^-$-type, while the drain terminal DN may be doped with n$^+$-type. A barrier voltage $V_{PB}$ may be input to the transfer gate electrode TG3' of the transfer transistor connected to the photodiode PD3'. The power supply voltage $V_{PIX}$ may be input to the drain terminal DN. Therefore, electric charges generated in the photodiode PD3' may not migrate to the floating diffusion region FD and may be discharged to the drain terminal DN.

In the case in which the transfer gate electrode TG3' is not present between the floating diffusion region FD and the drain terminal DN, when a sufficient potential barrier is not formed between the floating diffusion region FD and the photodiode PD3', a portion of electric charges generated in the photodiode PD3' may migrate to the floating diffusion region FD.

According to an example embodiment, the third transfer gate electrode TG3 and the fourth transfer gate electrode TG4 may connected to each other to constitute a single transfer gate electrode TG3', and the barrier voltage $V_{PB}$ may be input to the transfer gate electrode TG3'. As the barrier voltage $V_{PB}$ is input to the transfer gate electrode TG3', a high potential barrier may be formed between the floating diffusion region FD and the photodiode PD3'. Accordingly, it may be difficult for the electric charges, generated in the photodiode PD3', to migrate to the floating diffusion region FD. As a result, an effect of discharging the electric charges, generated in the photodiode PD3', to the drain terminal DN may be significantly improved.

Figure 12A:
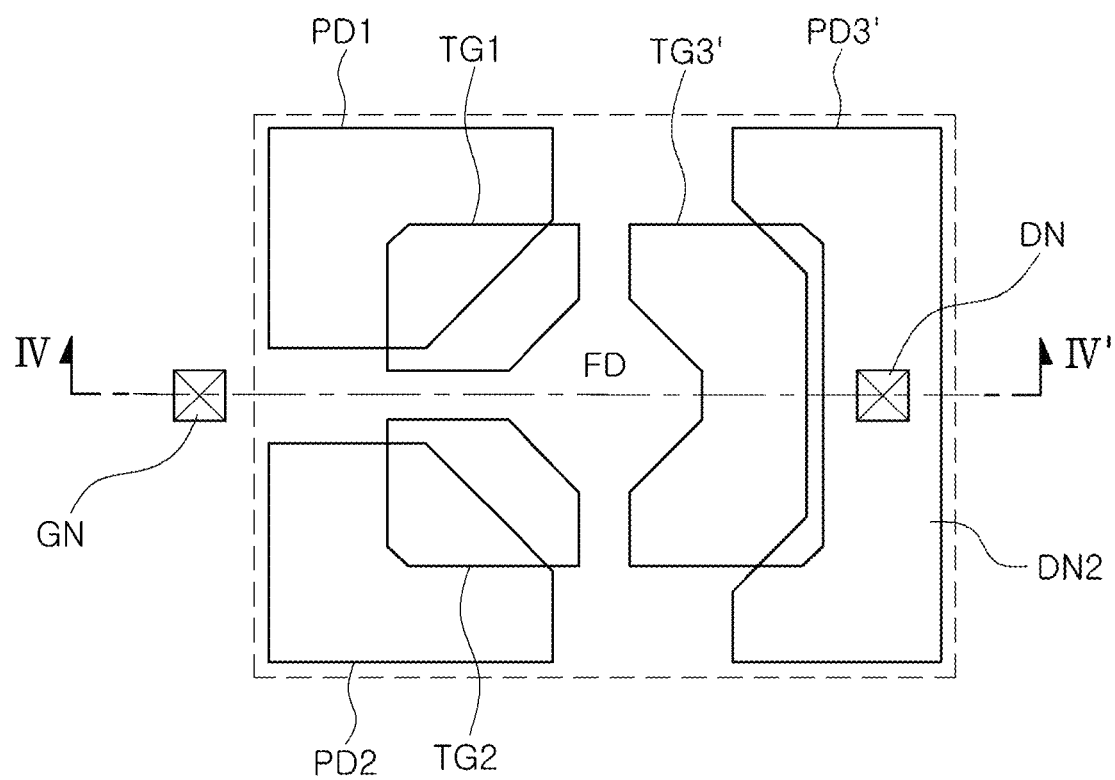
FIG. 12A is a plan view of an autofocusing pixel group according to an example embodiment.
Figure 12B:
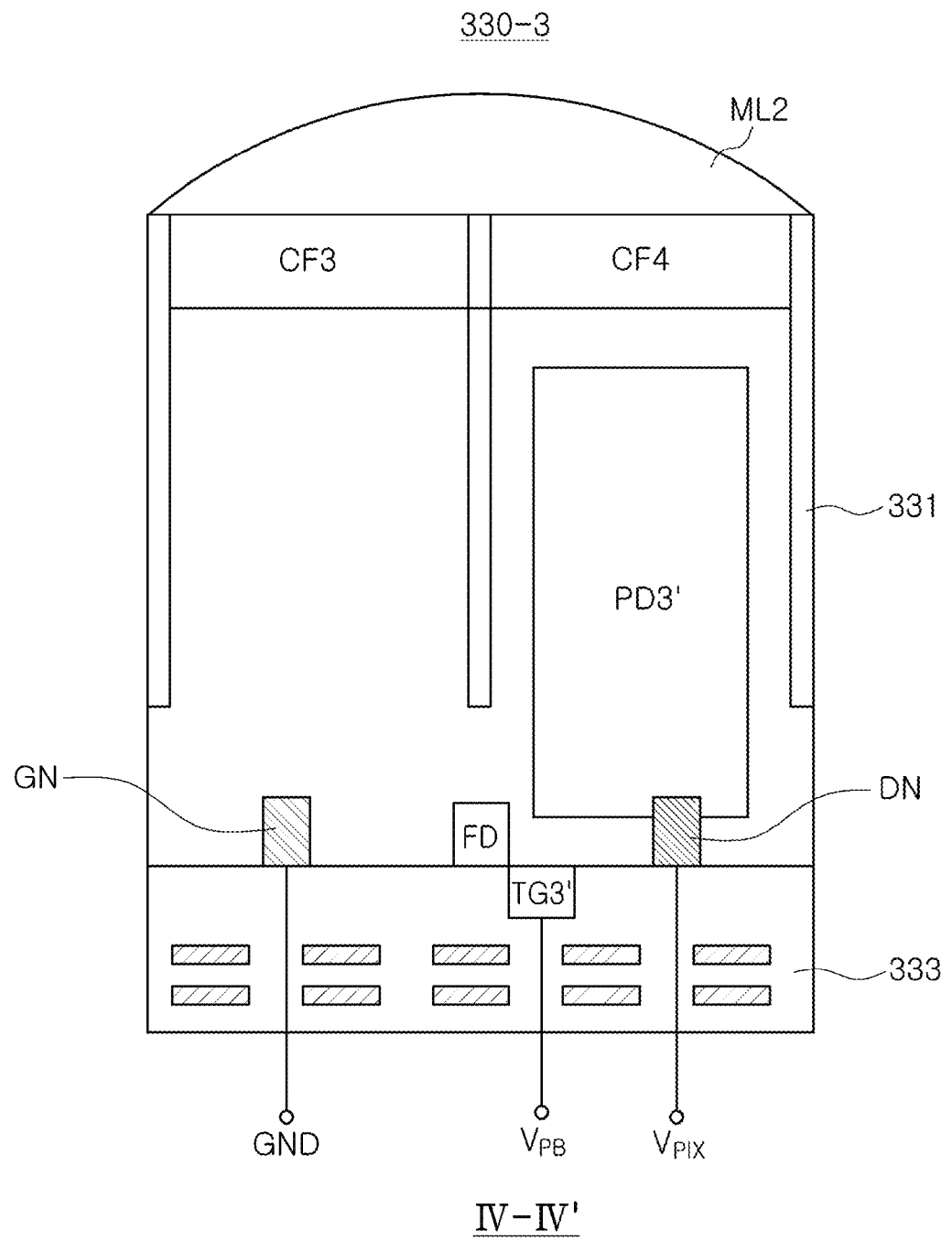
FIG. 12B is a cross-sectional view taken along line IV-IV' in FIG. 12A.

FIG. 12A is a plan view of an autofocusing pixel group according to an example embodiment, and FIG. 12B is a cross-sectional view taken along line IV-IV' in FIG. 12A.

Unlike the autofocusing pixel group 330-2 of FIG. 11A, an autofocusing pixel group 330-3 of FIG. 12A may further include a ground terminal GN. The ground terminal GN may supply a ground voltage to unit pixels included in a pixel array.

The ground terminal GN may be disposed in each normal pixel group. As a p$^+$-type ground terminal GN approaches n-type photodiodes, dark current may be increased. As the dark current is increased, a signal detected even when light is not irradiated (a dark level) may be increased. As the dark level is increased, the ground terminal GN may act as a factor causing noise in an image sensor.

In an image sensor according to an example embodiment, a ground terminal GN may be disposed in respective autofocusing pixel groups smaller in number than normal pixel groups. Accordingly, the number of factors, causing noise in the image sensor, may be decreased. Even when the ground terminal GN is disposed in each of the autofocusing pixel groups, a sufficient ground voltage may be supplied to unit pixels included in the pixel array.

Referring to FIG. 12B, a barrier voltage $V_{PB}$ may be input to a transfer gate electrode TG3' of a transfer transistor connected to a photodiode PD3', a power supply voltage $V_{PIX}$ may be input to a drain terminal DN, and a ground voltage GND may be input to the ground terminal GN. As the ground voltage GND is input to each of the ground terminals GN included in the autofocusing pixel groups, the ground voltage GND may be supplied to unit pixels included in the pixel array.

Figure 13A:
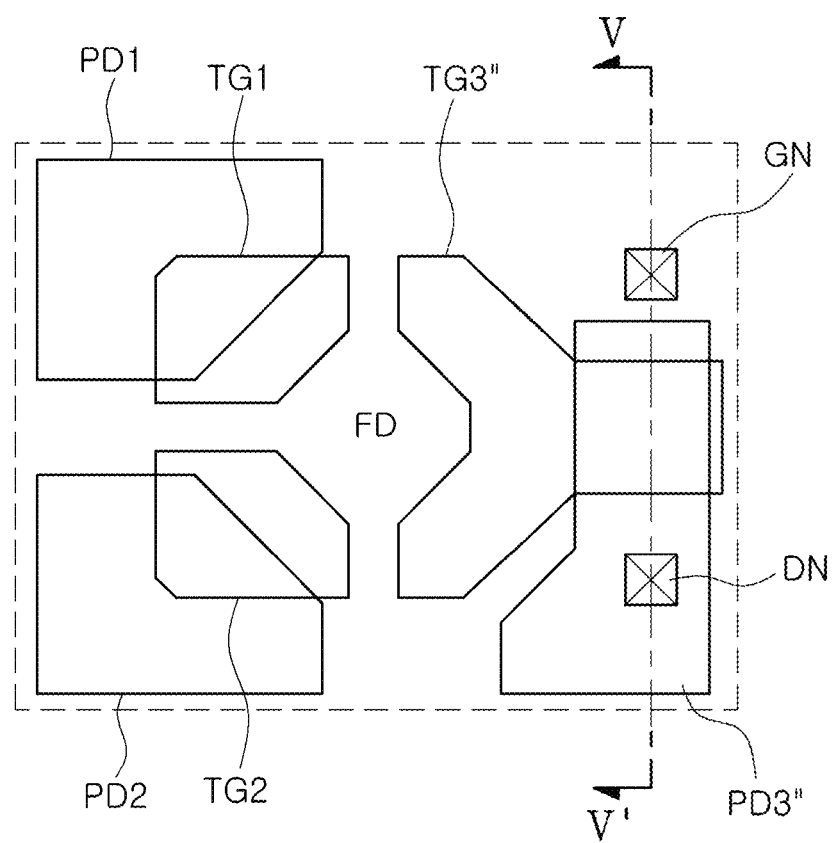
FIG. 13A is a plan view of an autofocusing pixel group according to an example embodiment.
Figure 13B:
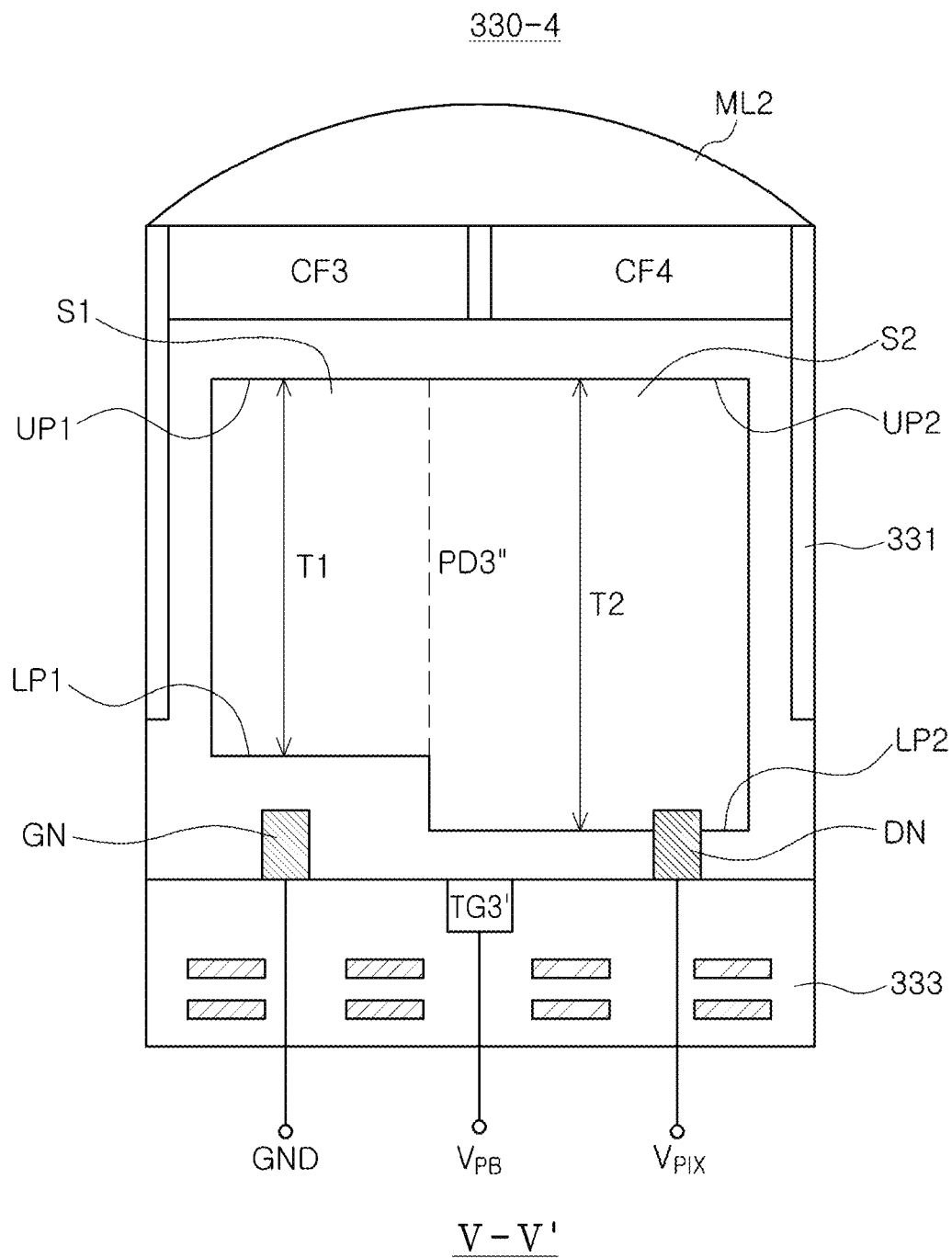
FIG. 13B is a cross-sectional view taken along line V-V' in FIG. 13A.

FIG. 13A is a plan view of an autofocusing pixel group according to an example embodiment, and FIG. 13B is a cross-sectional view taken along line V-V' in FIG. 13A.

Referring to FIG. 13A, unlike the autofocusing pixel group 330-3 of FIG. 12A, an autofocusing pixel group 330-4 of FIG. 13A is an autofocusing pixel group in which a ground terminal GN is disposed in a region including a drain photodiode PD3'' formed therein, rather than in a region including autofocusing photodiodes PD1 and PD2 formed therein. As an n$^+$-type drain terminal DN and a p$^+$-type ground terminal GN approach, an electric field may be increased between a drain terminal DN and the ground terminal GN. As the electric field is increased, an image defect (for example, a white spot) may occur.

In the image sensor according to the example embodiment, a transmission gate electrode TG3'' may be formed to extend from a photodiode PD3''. For example, the transfer gate electrode TG3'' may have a Y shape. The transfer gate electrode TG3'' may extend from the photodiode PD3'' to be disposed between the drain terminal DN and the ground terminal GN. The transfer gate electrode TG3", disposed between the drain terminal DN and the ground terminal GN, may prevent an electric field from increasing between the drain terminal DN and the ground terminal GN.

In addition, when a third transfer gate electrode TG3 and a fourth transfer gate electrode TG4 are separately disposed, a contact may be disposed on each of the third transfer gate electrode TG3 and the fourth transfer gate electrode TG4. The contact may be connected to a metal layer. However, when the third transfer gate electrode TG3 and the fourth transfer gate electrode TG4 are connected to each other to constitute a single transfer gate electrode TG3" and the transfer gate electrode TG3" extends from the photodiode PD3", a single contact may be disposed on the transfer gate electrode TG3". The contact may be connected to the metal layer.

Referring to FIG. 13B, the photodiode PD3" of the autofocusing pixel group 330-4 of FIG. 13B may include a first region S1 and a second region S2. The first region S1 may be disposed on the ground terminal GN, and the second region S2 may be disposed on the drain terminal DN.

The first region S1 may have a thickness T1 different from a thickness T2 of the second region S2. For example, the first region S1 may have a thickness T1 less than a thickness T2 of the second region S2. In this case, an upper surface UP1 of the first region S1 may have the same depth as an upper surface UP2 of the second region S2, and a lower surface LP1 of the first region S1 may have the same depth as a lower surface LP1 of the second region S2, and the second region S2 may have a height LP1 different from a height LP2 of the lower surface S2.

A barrier voltage $V_{PB}$ may be input to a transfer gate electrode TG3' of the transfer transistor connected to the photodiode PD3', a power supply voltage $V_{PIX}$ may be input to the drain terminal DN, and a ground voltage GND may be input to the ground terminal GN.

Figure 14A:
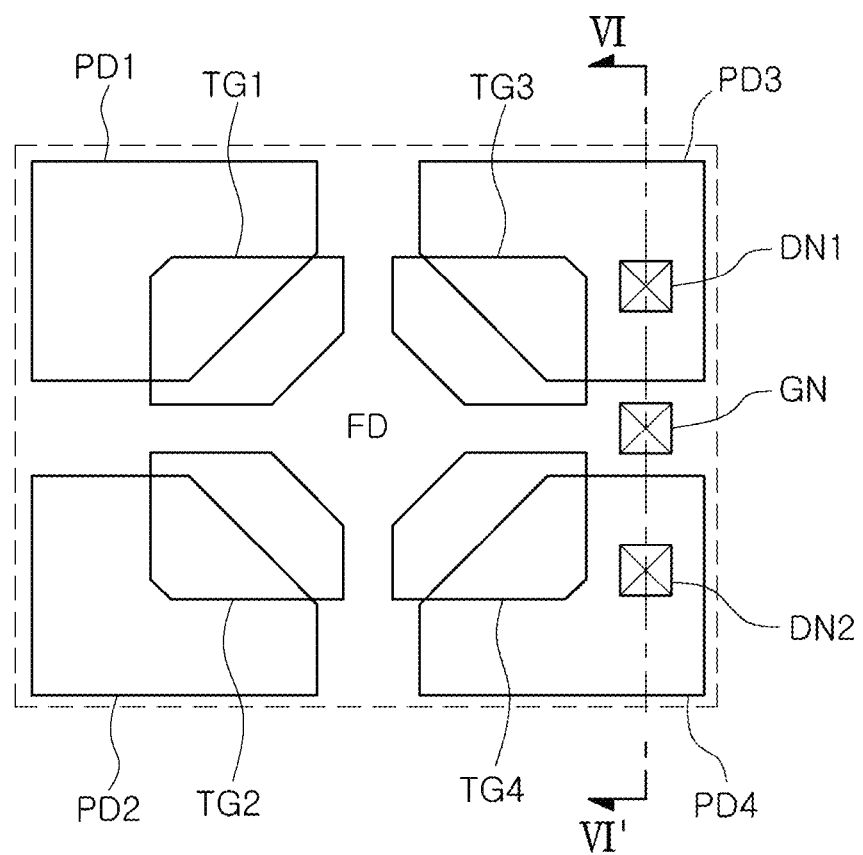
FIG. 14A is a plan view of an autofocusing pixel group according to an example embodiment.
Figure 14B:
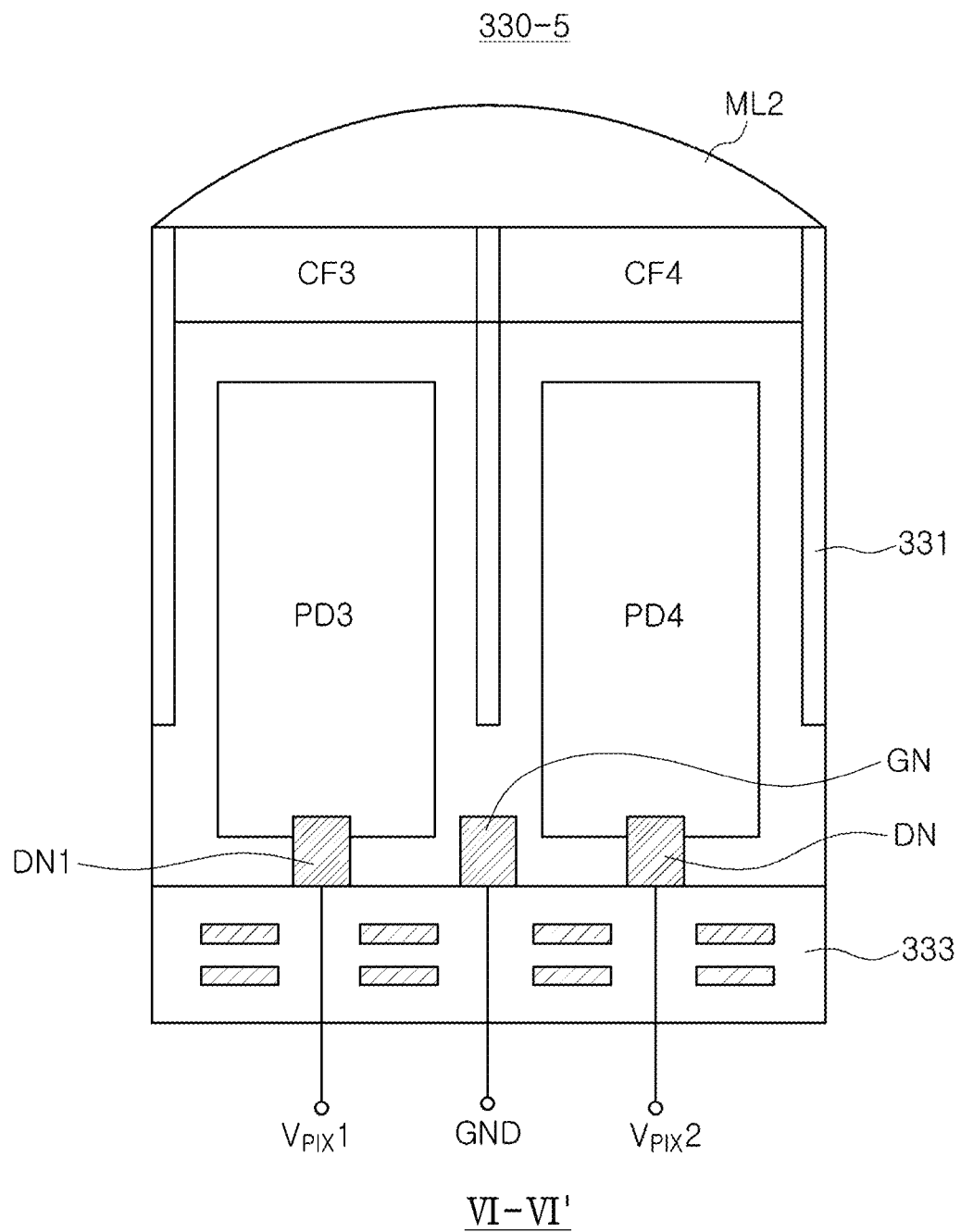
FIG. 14B is a cross-sectional view taken along line VI-VI' in FIG. 14A.

FIG. 14A is a plan view of an autofocusing pixel group according to an example embodiment, and FIG. 14B is a cross-sectional view taken along line VI-VI' in FIG. 14A.

Referring to FIG. 14A, an autofocusing pixel group 330-5 may have a first drain terminal DN1, connected to a third photodiode PD3, and a second drain terminal DN2 connected to a fourth photodiode PD4. The ground terminal GN may be disposed between the first drain terminal DN1 and the second drain terminal DN2.

Unlike the autofocusing pixel group of FIG. 13A, an autofocusing pixel group of FIG. 14A may have the same layout of the drain photodiodes PD3 and PD4 and transfer gate electrodes TG3 and TG4 as a normal pixel group. Therefore, it may be advantageous in terms of process management.

Referring to FIG. 14B, a first power supply voltage $V_{PIX}1$ may be input to a first drain terminal DN1 connected to a third photodiode PD3, and a second power supply voltage $V_{PIX}2$ may be input to a second drain terminal DN2 connected to the fourth photodiode PD4. A ground voltage GND may be input to a ground terminal GN.

Figure 15:
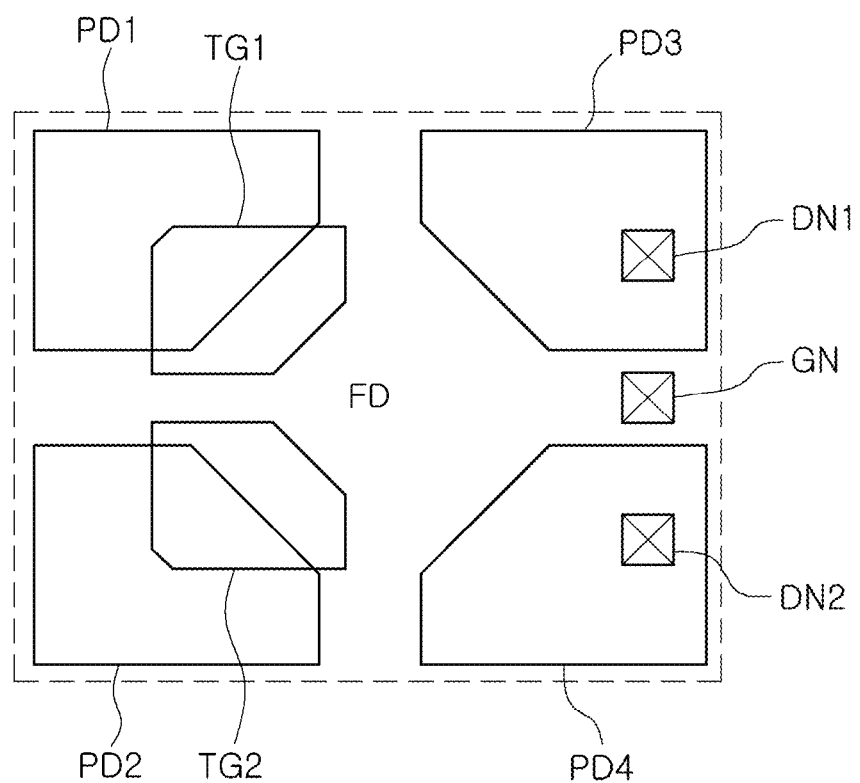
FIG. 15 is a plan view of an autofocusing pixel group according to an example embodiment.

FIG. 15 is a plan view of an autofocusing pixel group according to an example embodiment. Unlike the autofocusing pixel group 330-5 of FIG. 14A, a autofocusing pixel group 330-6 of FIG. 15 may not include the third transfer gate electrode and the fourth transfer gate electrode. This is because, when both a potential barrier between a third photodiode PD3 and a floating diffusion region FD and a potential barrier between a fourth photodiode PD4 and the floating diffusion region FD are formed to be sufficiently high, electric charges generated in the third photodiode PD3 and the fourth photodiode PD4 do not migrate to the floating diffusion region FD and may be discharged to terminals DN1 and DN2.

Figure 16:
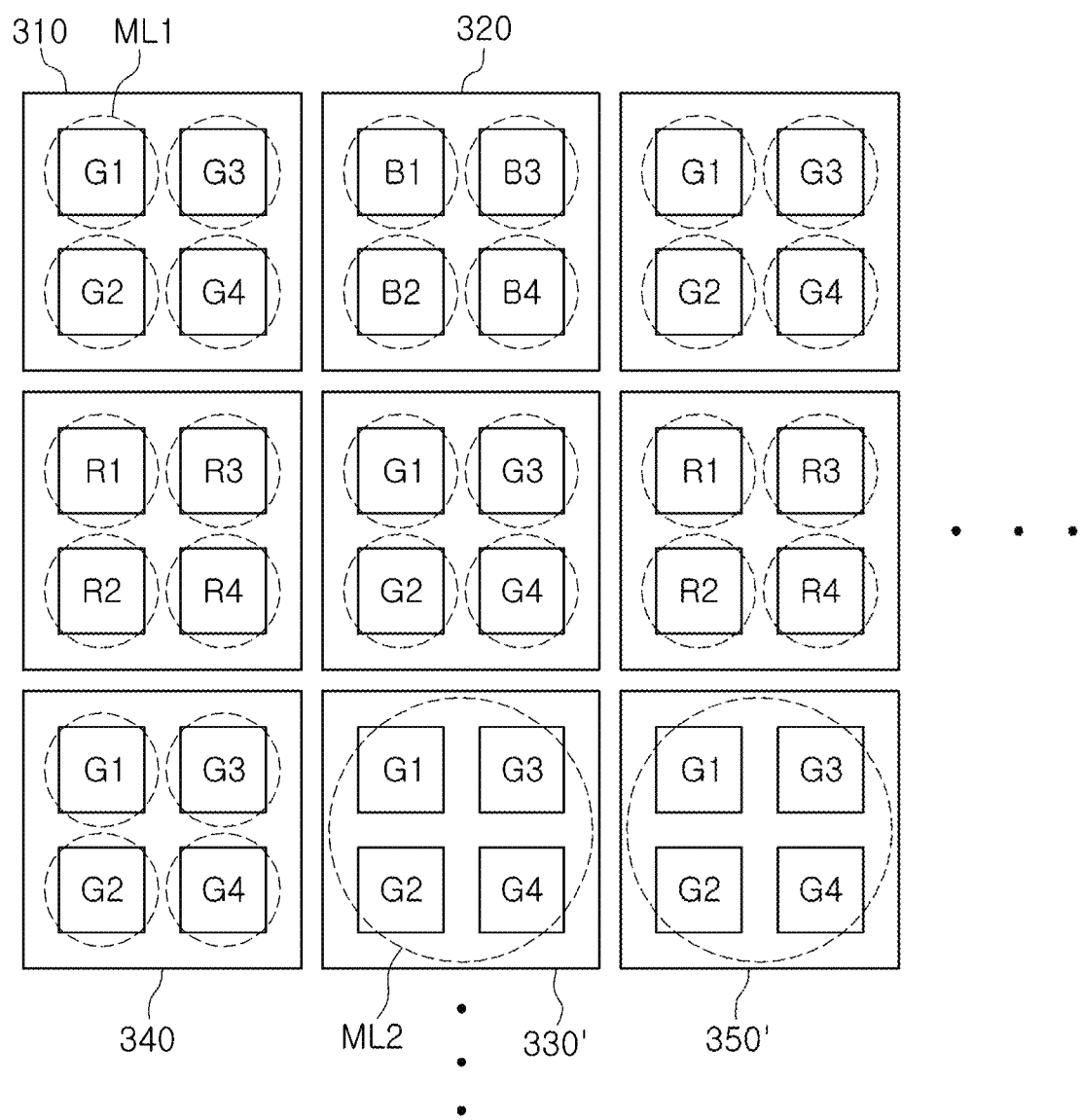
FIG. 16 illustrates a pixel array according to an example embodiment.
Figure 17:
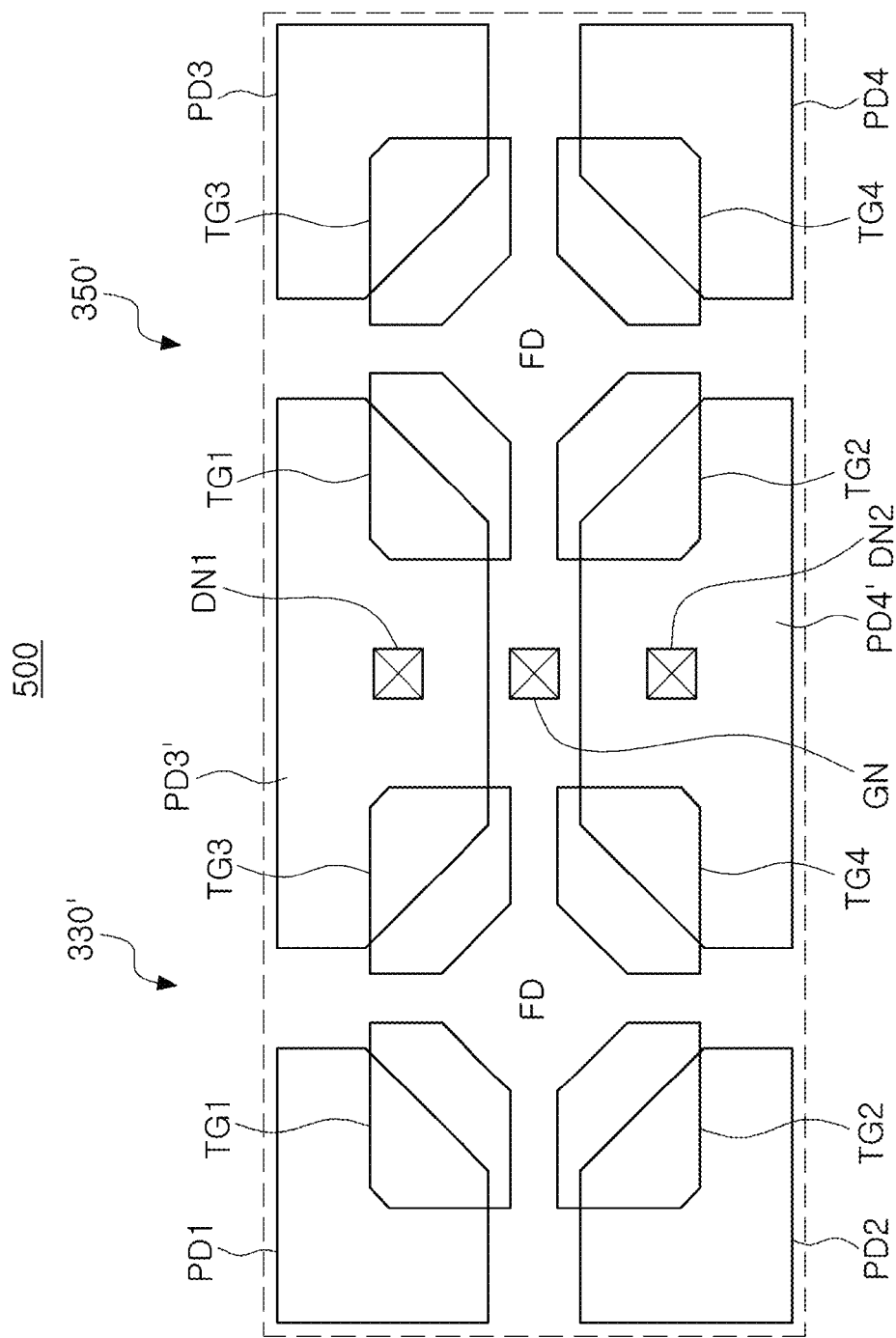
FIG. 17 is a plan view of autofocusing pixel groups according to an example embodiment.

FIG. 16 illustrates a pixel array according to an example embodiment, and FIG. 17 is a plan view of autofocusing pixel groups according to an example embodiment.

Referring to FIG. 16, a third pixel group 330' and a fifth pixel group 350', adjacent to each other in the pixel array 500, may each be an autofocusing pixel group. For example, the third pixel group 330' may generate first image data (for example, left image data), and the fifth pixel group 350' may generate second image data (for example, right image data).

Referring to both FIGS. 16 and 17, a third photodiode PD3 of the third pixel group 330' and a first photodiode PD1 of the fifth pixel group 350' may connected to each other to constitute a photodiode PD3'. Therefore, a single first drain terminal DN1 may be connected to the photodiode PD3'.

In addition, a fourth photodiode PD4 of the third pixel group 330' and a second photodiode PD2 of the fifth pixel group 350' may be connected to each other to constitute a single photodiode PD4'. Therefore, a single second drain terminal DN2 may be connected to the photodiode PD4'.

The ground terminal GN may be disposed between the first drain terminal DN1 and the second drain terminal DN2.

Figure 18:
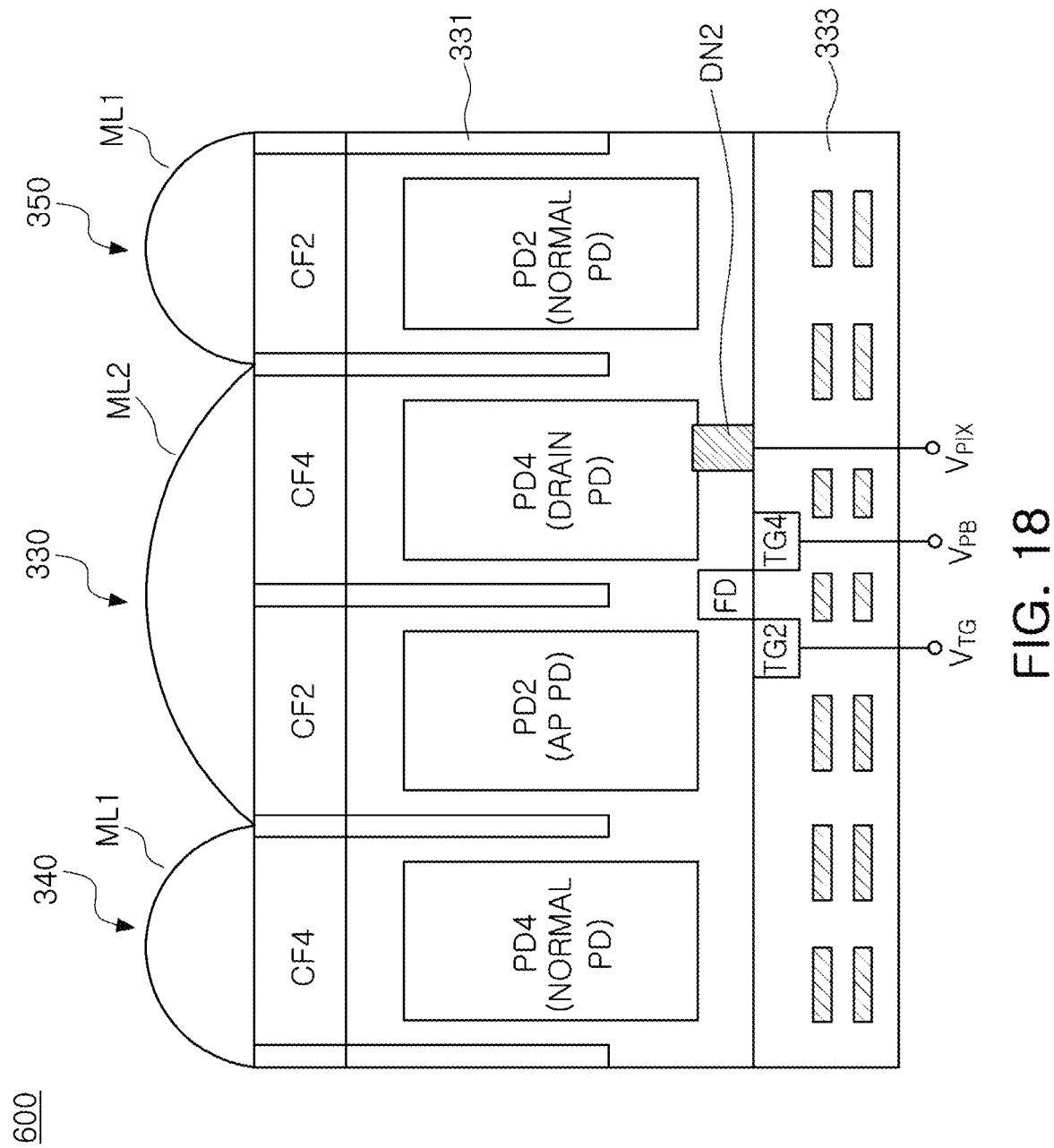
FIG. 18 is a partial cross-sectional view of pixels according to an example embodiment.

FIG. 18 is a partial cross-sectional view of pixels according to an example embodiment.

Referring to FIG. 18, a third pixel group 330 of a pixel array 600 may be an autofocusing pixel group. A second unit pixel of the third pixel group 330 may include a second photodiode PD2 and a color filter CF2, and a fourth unit pixel of the third pixel group 330 may include a fourth photodiode PD4 and a color filter CF4. The second unit pixel and the fourth unit pixel of the third pixel group 330 may share a single microlens ML2. The second photodiode PD2 of the third pixel group 330 may be an autofocusing photodiode, and the fourth photodiode PD4 of the third pixel group 330 may be a drain photodiode.

Each of the fourth pixel group 330 and a fifth pixel group 350 may be a normal pixel group. The fourth unit pixel of the fourth pixel group 330 may include a fourth photodiode PD4, a fourth color filter CF4, and a microlens ML1. The second unit pixel of the fifth pixel group 350 may include a second photodiode PD2, a second color filter CF2, and a microlens ML1.

A BDTI structure may be formed between unit pixels to vertically extend from a first surface LP of a semiconductor substrate SL. A second drain terminal DN2 may be formed between the fourth photodiode PD4 of the third pixel group 330 and a second surface UP of a semiconductor substrate SL by increasing an n-type doping concentration.

A transfer control signal $V_{TG}$ may be input to a second transfer gate electrode TG2 of the second transfer transistor connected to the second photodiode PD2 of the third pixel group 330. Thus, the second transfer transistor can be turned on. When the second transfer transistor remains in a turned-on state, a potential level of a channel region below the second transfer gate electrode TG2 is higher than a potential level of the second photodiode PD2, and thus, electric charges generated in the second photodiode PD2 may migrate to a floating diffusion region FD.

A barrier voltage $V_{PB}$ may be input to a fourth transfer gate electrode TG4 of the fourth transfer transistor connected to the fourth photodiode PD4 of the third pixel group 330. A power supply voltage $V_{PIX}$ may be input to the second drain terminal DN2. Therefore, a potential barrier may be provided between the fourth photodiode PD3 and the floating diffusion region FD due to a difference between a potential level of the fourth photodiode PD4 and a potential level the channel region below the fourth transfer gate electrode TG4. Electric charges, generated in the fourth photodiode PD4, may not migrate to the floating diffusion region FD due to the potential barrier and may be discharged to the second drain terminal DN2. According to an example embodiment, the third pixel group 330 may not include the fourth transfer gate electrode TG4.

An image sensor may generate first image data or second image data using the electric charges generated in the second photodiode PD2 of the third pixel group 330. The image sensor may perform an autofocusing function using the first image data and the second image data.

The image sensor may generate image data using the electric charges generated in the fourth photodiode PD4 of the fourth pixel group 330 and the second photodiode PD2 of the fifth pixel group 350. The image sensor may generate an image using the image data.

Figure 19A:
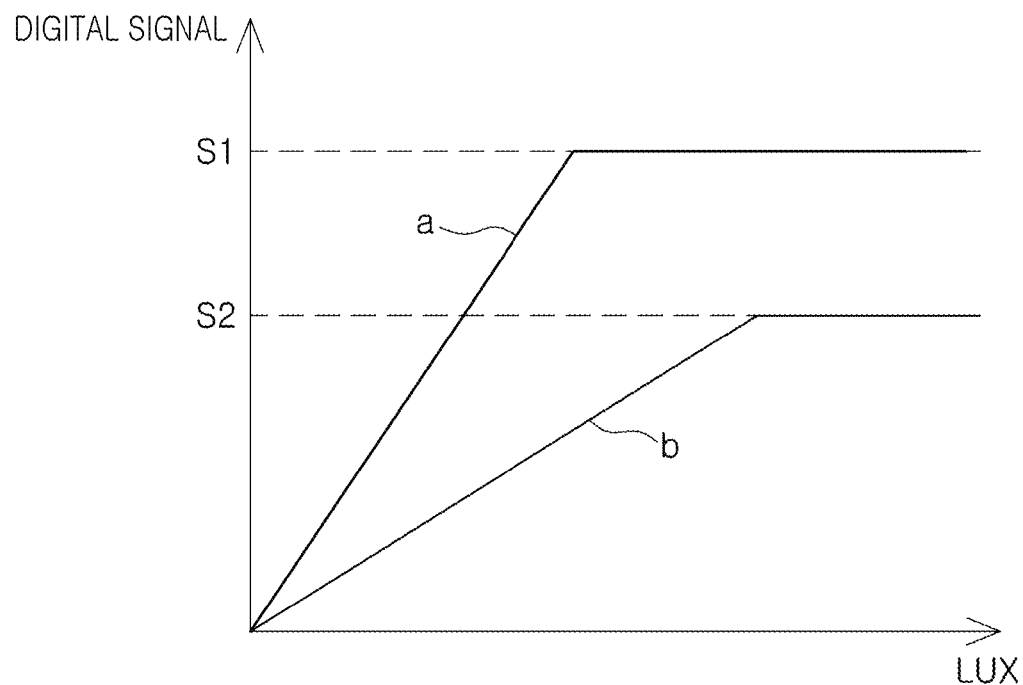
FIGS. 19A and 19B illustrate sensitivity of an image sensor according to an example embodiment.
Figure 19B:
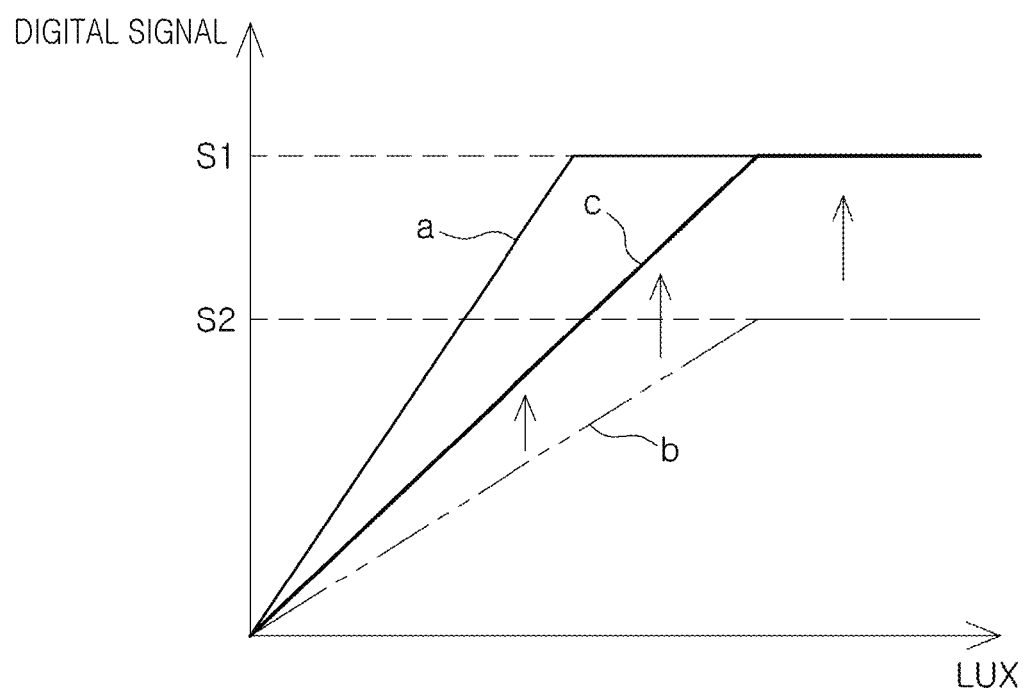

FIGS. 19A and 19B illustrate sensitivity of an image sensor according to an example embodiment.

Referring to FIGS. 19A and 19B, an X-axis may represent illuminance (LUX), and a Y-axis may represent an output of an analog-to-digital converter, for example, a digital signal. There may be an allowable range in an analog input values which may be converted by an analog-to-digital converter. When an input which may be out of the allowable range is applied, the input may have a saturated value SAT within an electrically allowable range. For example, the analog-to-digital converter may represent resolutions of up to 10 bits. In this case, the analog-to-digital converter may output 0 to 1023 LSB, and the saturated value SAT may be 1023 LSB.

In FIGS. 19A and 19B, a graph "a" may denote a first signal S1 generated from a normal pixel group, and a graph "b" may denote a second signal S2 generated from an autofocusing pixel group. The first signal S1 may correspond to the amount of summed electric charges output from four photodiodes included in the normal pixel group. The second signal S1 may correspond to the amount of summed electric charges output from two autofocusing photodiodes included in the autofocusing pixel group.

As illustrated in FIG. 19A, sensitivity of the autofocusing pixel group may be less than sensitivity of the normal pixel group. Therefore, when the sensitivity of the autofocusing pixel group increases by the sensitivity of the normal pixel group as shown in the graph "c" of FIG. 19B, the sensitivity of the normal pixel group and the sensitivity of the autofocusing pixel group may be substantially the same.

For example, conversion gains CG, applied when electric charges generated in photodiodes included in the autofocusing pixel group into a voltage, may be adjusted. For example, a conversion gain of electric charges, generated in the photodiode included in the autofocusing pixel group, may be greater than a conversion gain of electric charge generated in the photodiode included in the normal pixel group.

As a first embodiment, a distance between a metal layer connected to a floating diffusion region and a metal layer around the floating diffusion region in the autofocusing pixel group may be adjusted.

For example, the shorter a distance between a first metal layer connected to the floating diffusion region and a metal layer around the first metal layer, the higher capacitance between the metal layers. Thus, a conversion gain CG of a photodiode may be decreased. However, the longer the distance between the metal layer connected to the floating diffusion region and the metal layer around the metal layer, the lower the capacitance between the metal layers. Thus, the conversion gain CG of the photodiode may be increased.

For example, the distance between the first metal layer connected to the floating diffusion region of the normal pixel group and the metal layer around the metal layer may be shorter than the distance between the second metal layer connected to the floating diffusion region of the autofocusing pixel group and the metal layer around the second metal layer. Thus, the sensitivity of the normal pixel group and the sensitivity of the autofocusing pixel group may be substantially the same.

As a second embodiment, at least one of a width and a length of the metal layer connected to the floating diffusion region may be adjusted. For example, the width of the second metal layer connected to the floating diffusion region of the autofocusing pixel group may be smaller than a width of the first metal layer connected to the floating diffusion region of the normal pixel group. The less the width of the metal layer connected to the floating diffusion region, the more the conversion gain CG of the photodiode may be increased. In addition, the length of the second metal layer connected to the floating diffusion region of the autofocusing pixel group may be less than the length of the first metal layer connected to the floating diffusion region of the normal pixel group. The less the length of the metal layer connected to the floating diffusion region is shorter, the more the conversion gain CG of the photodiode may be increased.

As a third embodiment, when a color filter of each of the unit pixels included in the autofocusing pixel group is a white color filter, sensitivity of the photodiode may be increased.

As a fourth embodiment, a concentration of impurities, implanted into the floating diffusion region, may be adjusted. For example, a concentration of impurities, implanted into the floating diffusion region of the autofocusing pixel group, may be lower than a concentration of impurities implanted into the floating diffusion region of the normal pixel group. The lower the concentration of the floating diffusion region, the more the conversion gain CG of the photodiode may be increased.

In this application, a single pixel group has been illustrated and described as including two autofocusing photodiodes and two drain photodiodes. However, a single pixel group may include at least one autofocusing photodiode and at least one drain photodiode.

Figure 20:
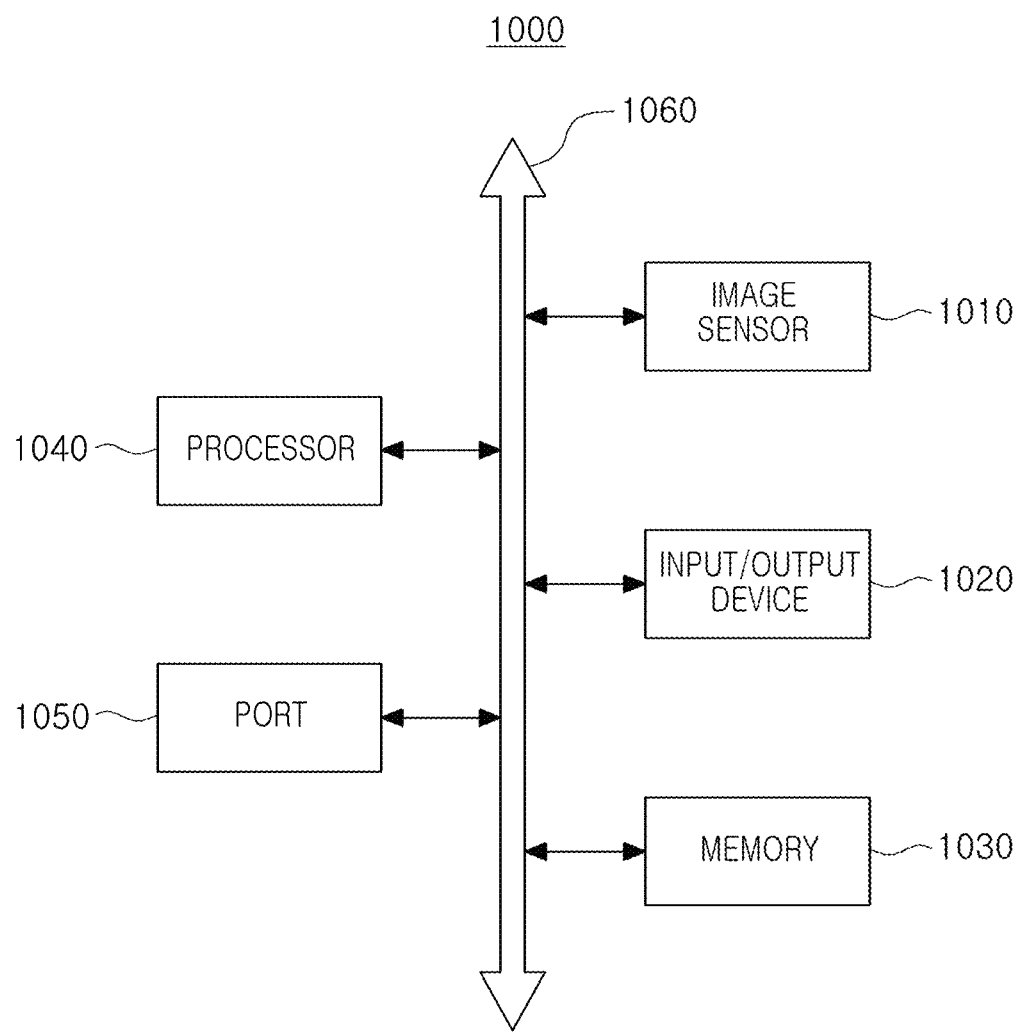
FIG. 20 is a schematic block diagram of an electronic device including an image sensor according to an example embodiment.

FIG. 20 is a schematic block diagram of an electronic device including an image sensor according to an example embodiment.

A computer device 1000 according to an example embodiment illustrated in FIG. 20 may include an image sensor 1010, an input/output device 1020, a memory 1030, a processor 1040, a port 1050, and the like. In addition, the computer device 1000 may further include a wired/wireless communications device, a power supply, and the like. Among the components illustrated in FIG. 20, the port 1050 may be an element for communicating with a video card, a sound card, a memory card, an USB card, or the like. The computer device 1000 may be a smartphone, a tablet personal computer (PC), a smart wearable device, or the like, in addition to a general desktop computer or a laptop computer.

The processor 1040 may perform specific operations, commands, tasks, or the like. In some embodiments, the processor 1040 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), an analog element (e.g., circuit), an application processor, etc. The processor 1040 may be a central processing unit (CPU), a microprocessor unit (MCU), a system on chip (SoC), or the like, and the processor 1040 may communicate with the image sensor 1010, the display 1020, and the memory 1030, as well as other devices connected to the port 1050, via a bus 1060.

The memory 1030 may be a storage medium for storing data used for operation of the electronic device 1000, multimedia data, and the like. The memory 1030 may include a volatile memory such as a random-access memory (RAM), or a non-volatile memory such as a flash memory. The memory 1030 may also include a solid-state drive (SSD), a hard disk drive (HDD), or an optical disk drive (ODD) as a storage device. An input and output device may also be included in the electronic device 1000 or be connected with the electronic device 1000 and may include an input device such as a keyboard, a mouse, a touch screen, and the like, and an output device such as a display, an audio output unit, and the like, provided to a user.

The image sensor 1010 may be mounted on a package substrate and may be connected to the processor 1040 by the bus 1060 or by another communication means. The image sensor 1010 may be employed in the electronic device 1000 as in the example embodiments described with reference to FIGS. 1 to 19.

As described above, a drain terminal, connected to at least one photodiode among photodiodes constituting a pixel group, may be formed by adjusting a doping concentration between the at least one photodiode and a substrate. Electric charges, generated in the at least one photodiode, may not migrate to a floating diffusion region and may be discharged to the drain terminal. As a result, crosstalk may be limited and/or prevented from occurring when the pixel group provides an autofocusing function.

While example embodiments have been shown and described above, it will be apparent to those skilled in the art that modifications and variations could be made without departing from the scope of inventive concepts as defined by the appended claims.

What is claimed is:

1. An image sensor comprising:
a first photodiode group and a second photodiode group, the first photodiode group including a first photodiode and a second photodiode, and the second photodiode group including photodiodes;
a first transfer transistor group including a first transfer transistor connected to the first photodiode group and a second transfer transistor connected to the second photodiode of the first photodiode group;
a floating diffusion region of a substrate, the floating diffusion region configured to store electric charges generated in the first photodiode group as at least one of the first transfer transistor and the second transfer transistor of the first transfer transistor group is turned on; and
a power supply node connected to the second photodiode group, the power supply node configured to have a power supply voltage applied thereto for applying the power supply voltage to the second photodiode group, the power supply voltage allowing electric charges, generated in the second photodiode group to migrate to the power supply node; and a second transfer transistor group including at least one transfer transistor connected to the second photodiode group,
the at least one transfer transistor of the second transfer transistor group configured to have a barrier voltage applied thereto, and
the barrier voltage forming a potential barrier between the second photodiode group and the floating diffusion region.

2. The image sensor of claim 1, further comprising:
a device isolation layer electrically isolating the second photodiode of the first photodiode group and one of the photodiodes in the second photodiode group from each other; and
a drain terminal connected to the second photodiode group, wherein
the image sensor is configured to discharge electric charges, generated from the second photodiode group, to the drain terminal in response to the power supply voltage being applied to the drain terminal.

3. The image sensor of claim 2, wherein
the photodiodes of the second photodiode group include a third photodiode and a fourth photodiode, and
the at least one transfer transistor of the second transfer transistor group includes a third transfer transistor connected to the third photodiode and a fourth transfer transistor connected to the fourth photodiode.

4. The image sensor of claim 3, wherein
the first transfer transistor includes a first transfer gate electrode that is configured to have a first turn-on signal input thereto,
the second transfer transistor includes a second transfer gate electrode configured to have a second turn-on signal input thereto,
the third transfer transistor includes a third transfer gate electrode configured to have the barrier voltage input thereto, and
the fourth transfer transistor includes a fourth transfer gate electrode that is configured to have the barrier voltage input thereto.

5. The image sensor of claim 1, further comprising:
a ground terminal,
wherein the ground terminal is configured to supply a ground voltage to the image sensor.

6. The image sensor of claim 5, wherein
the photodiodes of the second photodiode group include a third photodiode and a fourth photodiode, and
the second photodiode group includes the first photodiode connected to a first drain terminal and the second photodiode connected to a second drain terminal, wherein
the image sensor is configured to discharge electric charges generated from the third photodiode to the first drain terminal in response to the power supply voltage being applied to the first drain terminal,
the image sensor is configured to discharge electric charges generated from the fourth photodiode to the second drain terminal in response to the power supply voltage being applied to the second drain terminal, and
the ground terminal is between the first drain terminal and the second drain terminal.

7. An image sensor comprising:
a first pixel area and a second pixel area sharing a single microlens, the first pixel area including a first photodiode and a second photodiode;
a device isolation layer electrically isolating the first pixel area and the second pixel area from each other;

at least one transfer transistor connected to the first pixel area, the at least one transfer transistor including a first transfer transistor connected to the first photodiode and a second transfer transistor connected to the second photodiode; and at least one drain terminal connected to the second pixel area and configured to have a power supply voltage applied thereto.

8. The image sensor of claim 7, wherein
the second pixel area includes a third photodiode and a fourth photodiode.

9. The image sensor of claim 8, further comprising:
a third transfer transistor connected to the third photodiode; and
a fourth transfer transistor connected to the fourth photodiode,
wherein the third photodiode and the fourth photodiode are connected to each other to constitute a single photodiode,
and a third transfer gate electrode of the third transfer transistor and a fourth transfer gate electrode of the fourth transfer transistor are connected to each other to constitute a single transfer gate electrode, and
the at least one drain terminal is connected to the single photodiode.

10. The image sensor of claim 9, wherein an area of the single photodiode is different than an area of the first photodiode and an area of the second photodiode.

11. The image sensor of claim 9, further comprising:
a floating diffusion region of a substrate, wherein
the image sensor is configured to migrate electric charges generated from the first photodiode and the second photodiode to the floating diffusion region, and
the image sensor is configured to discharge electric charges generated from the single photodiode to the at least one drain terminal.

12. The image sensor of claim 9, further comprising:
a floating diffusion region of a substrate, wherein
the single transfer gate electrode is configured to have a barrier voltage applied thereto, and
the barrier voltage forms a potential barrier between the single photodiode and the floating diffusion region.

13. The image sensor of claim 9, further comprising:
a ground terminal configured to supply a ground voltage to the image sensor,
wherein the single transfer gate electrode is between the ground terminal and the at least one drain terminal.

14. The image sensor of claim 13, wherein
the single photodiode has a first region and a second region,
the first region of the single photodiode is on the ground terminal,
the second region is on the at least one drain terminal, and
a thickness of the first region is different from a thickness of the second region.

15. The image sensor of claim 14, wherein
a depth of an upper surface of the first region is the same as a depth as an upper surface of the second region, and
a depth of a lower surface of the first region is different from a depth of a lower surface of the second region.

16. An image sensor comprising:
a normal pixel group configured to generate an image; and
an autofocusing pixel group configured to provide an autofocusing function,
the autofocusing pixel group and the normal pixel group having substantially a same sensitivity as each other,
the autofocusing pixel group including unit pixels sharing a single microlens and each including a single photodiode, a device isolation layer electrically isolating the unit pixels from each other, and a drain terminal configured to have a constant voltage input thereto,
the autofocusing pixel group including photodiodes,
the photodiodes in the autofocusing pixel group including a first photodiode group and a second photodiode group, and
the drain terminal being connected to the second photodiode group,
the first photodiode group configured to generate electric charges that migrate from the first photodiode group to a floating diffusion region of a substrate, and
the second photodiode group configured to generate electric charges that are discharged to the drain terminal.

17. The image sensor of claim 16, wherein a conversion gain of electric charges generated in a photodiode included in the autofocusing pixel group is greater than a conversion gain of electric charges generated in a photodiode included in the normal pixel group.

18. The image sensor of claim 16, wherein
a distance between a second metal layer connected to a floating diffusion region of the autofocusing pixel group and a metal layer around the second metal layer is longer than a distance between a first metal layer connected to a floating diffusion region of the normal pixel group and a metal layer around the first metal layer.

19. The image sensor of claim 16, wherein a second metal layer connected to a floating diffusion region of the autofocusing pixel group has a width less than a width of a first metal layer connected to a floating diffusion region of the normal pixel group.

20. The image sensor of claim 16, wherein a concentration of impurities in a floating diffusion region of the autofocusing pixel group is lower than a concentration of impurities in a floating diffusion region of the normal pixel group.

* * * * *